(12) United States Patent
Tomita

(10) Patent No.: US 8,093,149 B2
(45) Date of Patent: Jan. 10, 2012

(54) SEMICONDUCTOR WAFER AND MANUFACTURING METHOD FOR SEMICONDUCTOR DEVICE

(75) Inventor: Kazuo Tomita, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 507 days.

(21) Appl. No.: 12/183,795

(22) Filed: Jul. 31, 2008

(65) Prior Publication Data

US 2009/0032847 A1  Feb. 5, 2009

(30) Foreign Application Priority Data

Jul. 31, 2007 (JP) ................................ 2007-198475

(51) Int. Cl.
*H01L 21/4763* (2006.01)

(52) U.S. Cl. ..................... 438/618; 438/620; 438/622

(58) Field of Classification Search .................. 438/618, 438/620, 622
See application file for complete search history.

(56) References Cited

U.S. PATENT DOCUMENTS

| 7,244,672 B2 * | 7/2007 | Nguyen et al. | 438/618 |
| 2001/0045651 A1 * | 11/2001 | Saito et al. | 257/750 |
| 2002/0135041 A1 * | 9/2002 | Kunikiyo | 257/510 |
| 2002/0135042 A1 * | 9/2002 | Givens | 257/522 |
| 2005/0227451 A1 * | 10/2005 | Konno et al. | 438/424 |

FOREIGN PATENT DOCUMENTS

| JP | 2003-017559 | 1/2003 |
| JP | 2003-078005 | 3/2003 |
| JP | 2005-217319 | 8/2005 |
| JP | 2006-147681 | 6/2006 |

* cited by examiner

*Primary Examiner* — Long Tran
(74) *Attorney, Agent, or Firm* — McDermott Will & Emery LLP

(57) ABSTRACT

A semiconductor wafer and a manufacturing method for a semiconductor device are provided, which prevent peeling-off of films and pattern skipping in a wafer edge portion. A silicone substrate has formed thereon gate structures in active regions isolated by a trench isolation film; a contact interlayer film; and a multilayer interconnection structure formed by alternate laminations of low-k via interlayer films, i.e., V layers, and low-k interconnect interlayer films, i.e., M layers. In a Fine layer ranging from first to fifth interlayer films, the M layers are removed from the wafer edge portion, but the V layers are not removed therefrom. Further, the contact interlayer film is not removed from the wafer edge portion.

10 Claims, 54 Drawing Sheets

101

101

101

SEMICONDUCTOR WAFER AND MANUFACTURING METHOD FOR SEMICONDUCTOR DEVICE

BACKGROUND OF THE INVENTION

1. Field of the Invention

The present invention relates to a semiconductor wafer and a manufacturing method for a semiconductor device, and in particular, to a technique for preventing peeling-off of a film and pattern skipping in an end portion, i.e., a wafer edge portion, of a semiconductor substrate.

2. Description of the Background Art

In recent years, the reduction in element size has progressed and the dimensions of interconnect lines and vias have also been reduced. In order to increase the speed of elements, the demand for films with lower resistance and lower capacitance has increased in multilayer interconnections. Low-k films (low dielectric constant films), such as SiOC, ULK, and ELK with low dielectric constants (k), are now being used as interlayer films in multilayer. Such semiconductor wafers and their manufacturing methods are disclosed in, for example, Japanese Patent Application Laid-Open Nos. 2005-217319, 2003-78005, 2003-17559, and 2006-147681.

Japanese Patent Application Laid-Open No. 2005-217319, for example, discloses an invention that relates to a manufacturing method for a semiconductor device with Cu damascene multilayer interconnections using low dielectric constant films as interlayer films, wherein the degree in which the low dielectric constant interlayer films are backed off from the periphery is made different for each layer in the periphery of the wafer as a measure against peeling-off during CMP.

Japanese Patent Application Laid-Open No. 2003-78005, for example, discloses an invention that relates to a manufacturing method for a semiconductor device having multilayer interconnections using Low-k films as interlayer films, wherein the edges of the Low-k films are cut at the wafer edge.

Japanese Patent Application Laid-Open No. 2003-17559, for example, discloses an invention that relates to a manufacturing method for a semiconductor device with a multilayer interconnection structure using low dielectric constant interlayer films of Cu damascene interconnect lines, wherein the peripheral structure is such that low dielectric constant interlayer films are backed off from the wafer edge so as to be covered with an insulating film in ordinary circumstances.

Japanese Patent Application Laid-Open No. 2006-147681, for example, discloses an invention that relates to a manufacturing method for a semiconductor device with a multilayer interconnection structure using low dielectric constant films as interlayer films, wherein the structure is such that the low dielectric constant films are etched back from the wafer edge portion so as to be covered with an insulating film in ordinary circumstances.

Problems to be solved by the present invention are given in the following description by citing the case of a DD (dual damascene) procedure where Low-k films (SiOC, ULK, ELK; $k \leq 3.0$) are employed as Fine interlayer film layers (Mx, Vx) having the smallest dimensions.

In this case, the Fine interlayer films as the Low-k films have low strength and weak adhesion, and due to such stresses, they may peel off from the wafer edge portion during the lamination, which can undesirably cause a reduction in yield or the like.

There is also a problem that foreign matter resulting from the process (such as slurry residues after polishing) may exist in areas of the wafer edge portion where plating cannot be applied, which can cause a reduction in yield or the like.

In order to solve the problems, a technique for removing all interlayer films including a contact interlayer film from the wafer edge portion has been suggested. This technique, however, has a drawback that a barrier metal is deposited directly on the silicon substrate in the wafer edge portion so that, in subsequent processes, the films may peel off due to stresses caused mainly by heat treatment.

To avoid such a problem, another technique for removing all interlayer films except for the contact interlayer film from the wafer edge portion, i.e., not removing the contact interlayer film, has been suggested. As a result, a barrier metal, e.g., Ta, is not directly deposited on the silicon substrate in the wafer edge portion during a Cu process so that it is possible to prevent peeling-off of films in subsequent processes.

However, even if the contact interlayer film is intentionally left in such a manner, it may completely be removed by etching when a multilayer interconnection structure is formed by removal of the wafer edge in a via process and in an interconnection process during a dual damascene (DD) procedure. In this case, such a problem arises that a barrier metal, e.g., Ta, is directly deposited on the silicon substrate in the wafer edge portion during the Cu process, which can cause peeling-off of films.

SUMMARY OF THE INVENTION

An object of the present invention is to provide a semiconductor wafer and a manufacturing method for a semiconductor device, which prevent peeling-off of a film and pattern skipping in a wafer edge portion.

According to a preferred embodiment of the present invention, in a Fine layer ranging from first to fifth interlayer films, low-k interconnect interlayer films, i.e., Mx layers, are removed from the wafer edge portion, but low-k via interlayer films, i.e., Vx layers, are not removed from the wafer edge portion. Also, a contact interlayer film is not removed from the wafer edge portion.

This prevents a reduction in yield due to peeling-off of films from the wafer edge portion during the lamination of the first to fifth interlayer films. In addition, direct deposition of a barrier metal, e.g., Ta, on a silicon substrate in a Cu process prevents peeling-off of films in the wafer edge portion. Further, even if a multilayer interconnection structure is formed by removal of the wafer edge in a via process and in an interconnection process in a dual damascene procedure, it is possible to prevent the contact interlayer film from being completely removed by etching.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, preferred embodiments of the present invention are described in detail in reference to the drawings.

First Preferred Embodiment

Figure 1:
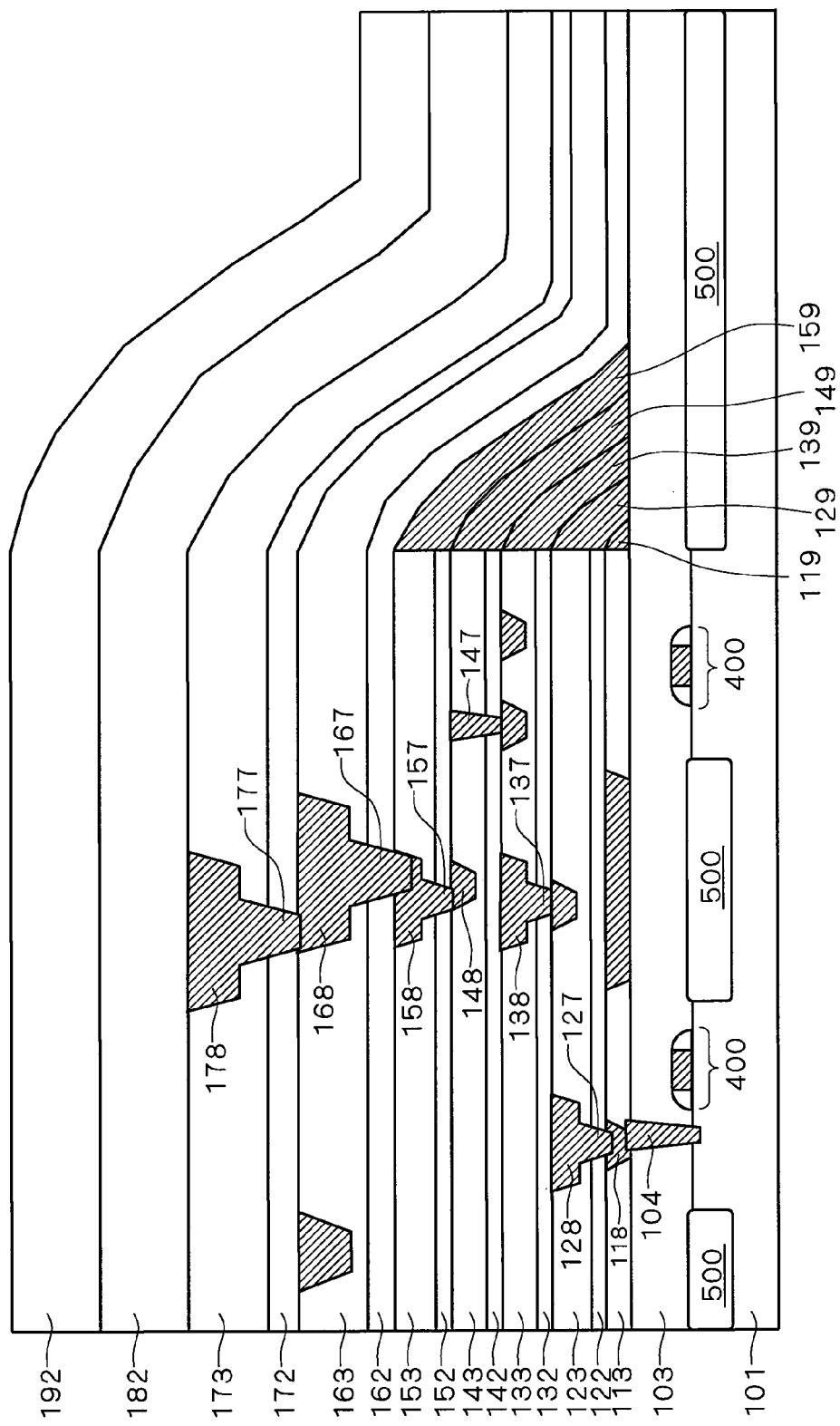
FIG. 1 is a cross sectional diagram showing the structure of a semiconductor wafer according to a first preferred embodiment.
Figure 2A:
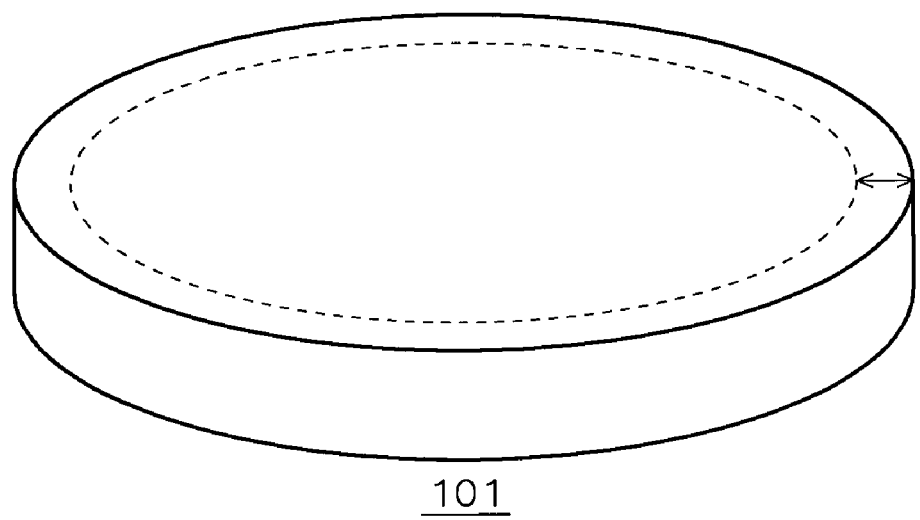
FIGS. 2A, 2B and 2C are a perspective diagram, a top diagram, and a side diagram, respectively, showing the structure of the semiconductor wafer according to the first preferred embodiment.
Figure 2B:
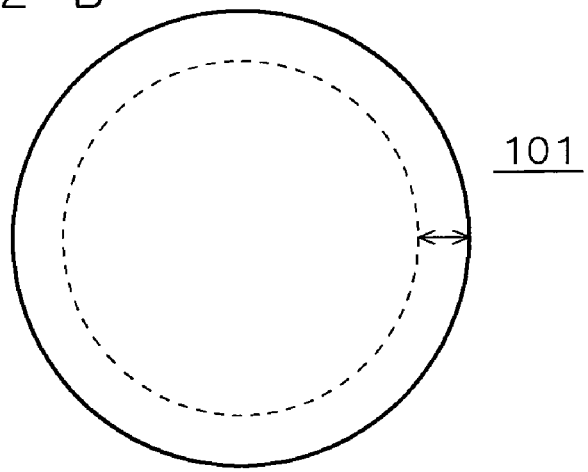
Figure 2C:
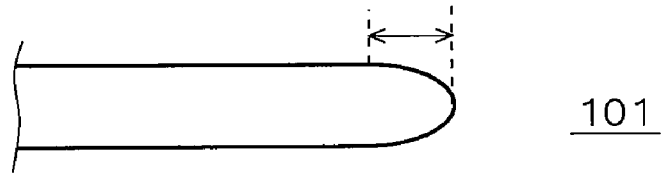

FIG. 1 is a cross sectional diagram showing the structure of a semiconductor wafer according to a first preferred embodiment. FIGS. 2A, 2B, and 2C are, respectively, a perspective diagram, a top diagram and a side diagram showing the semiconductor wafer in FIG. 1. FIG. 1 is an enlarged view of, as shown in FIGS. 2A to 2C, a wafer edge portion (indicated by the arrows) of a silicon substrate 101 as a semiconductor substrate.

In FIG. 1, a trench isolation film 500 is formed on a silicon substrate 101 by STI (shallow trench isolation). Gate structures 400 including a gate insulating film, a gate electrode, and sidewalls provided on both sides of the gate electrode are formed in active regions isolated by the trench isolation film 500.

A contact interlayer film 103 (first interlayer film) of, for example silicon oxide film, such as undoped silica glass (USG), is formed to a thickness of 400 nm on the silicon substrate 101 so as to cover the silicon substrate 101.

A contact plug 104 includes a contact barrier metal laminate film of a 20-nm thick TiN film and a 20-nm thick Ti film; and a W plug buried in the contact barrier metal laminate film, and it is formed so as to penetrate through the contact interlayer film 103.

A first interlayer film 113 of, for example, SiOC film (k to 2.8) is formed to a thickness of 100 nm on the contact interlayer film 103.

A first interconnect layer 118 is formed so as to penetrate through the first interlayer film 113, by forming a copper (Cu) interconnect line on a barrier metal of, for example, Ta having a thickness of 15 nm.

A first Cu residue 119 is Cu that is left in a sidewall form in a wafer edge portion when the first interconnect layer 118 is formed. It is, for example, patterned in a ring form at a position 3.0 mm away from the outer periphery of the wafer by peripheral exposing during lithography using a multilayer resist.

A second liner film 122 of, for example, a p-SiC film (k to 4.8) is formed to a thickness of 50 nm on the first interlayer film 113.

A second interlayer film 123 of, for example, an SiOC film (k to 2.8) is formed to a thickness of 300 nm on the second liner film 122.

The second interconnect layer 128 is formed so as to penetrate through the second interlayer film 123 and the second liner film 122, by forming copper (Cu) interconnect lines on a barrier metal of, for example, Ta having a thickness of 15 nm.

A second Cu residue 129 is Cu that is left in a sidewall form in a wafer edge portion when the second interconnect layer 128 is formed. It is, for example, patterned in a ring form at a position 3.0 mm away from the outer periphery of the wafer by peripheral exposure to light during lithography of a first via 127 using a multilayer resist.

Hereafter, a third liner film 132, a third interlayer film 133, a third interconnect layer 138, and a third Cu residue 139; a fourth liner film 142, a fourth interlayer film 143, a fourth interconnect layer 148, and a fourth Cu residue 149; and a fifth liner film 152, a fifth interlayer film 153, a fifth interconnect layer 158, and a fifth Cu residue 159 are formed in the order given in the same manner as the second liner film 122, the second interlayer film 123, the second interconnect layer 128, and the second Cu residue 129, all described above, are formed. Here, the films ranging from the first interlayer film 113 to the fifth interlayer film 153 form a Fine layer that includes a film with a dielectric constant of 3.0 or lower, i.e., a Low-k film and that is prone to peel off, so that they are removed from the wafer edge portion by peripheral exposure to light or the like during lithography in a via process (the process of forming a first via 127, a second via 137, a third via 147, and a fourth via 157).

Further, a sixth liner film 162, a sixth interlayer film 163, and a sixth interconnect layer 168; and a seventh liner film 172, a seventh interlayer film 173, and a seventh interconnect layer 178 are formed on top of the Fine layer as a semi-global layer having a greater thickness than the Fine layer. The sixth interlayer film 163 and the seventh interlayer film 173 formed of a silicon oxide film, such as fluorinated silica glass (FSG) (k to 3.7), include no Low-k (k≦3.0) film and thus are less prone to peel off, so that they are not removed from the wafer edge portion by peripheral exposure to light.

Furthermore, a first passivation film 182 with a laminated structure including, for example, p-SiN and p-SiO$_2$, and a second passivation film 192 of, for example, p-SiN are formed on the seventh interlayer film 173. The first passivation film 182 and the second passivation film 192 include no Low-k (k≦3.0) film and thus are less prone to peel off, so that they are not removed from the wafer edge portion by peripheral exposure to light or the like.

Hereafter, a pair of corresponding interlayer and liner films shall be referred to also collectively as a layer (e.g., the second interlayer film 123 and the second liner film 122 shall be referred to collectively as a second layer).

Figure 3:
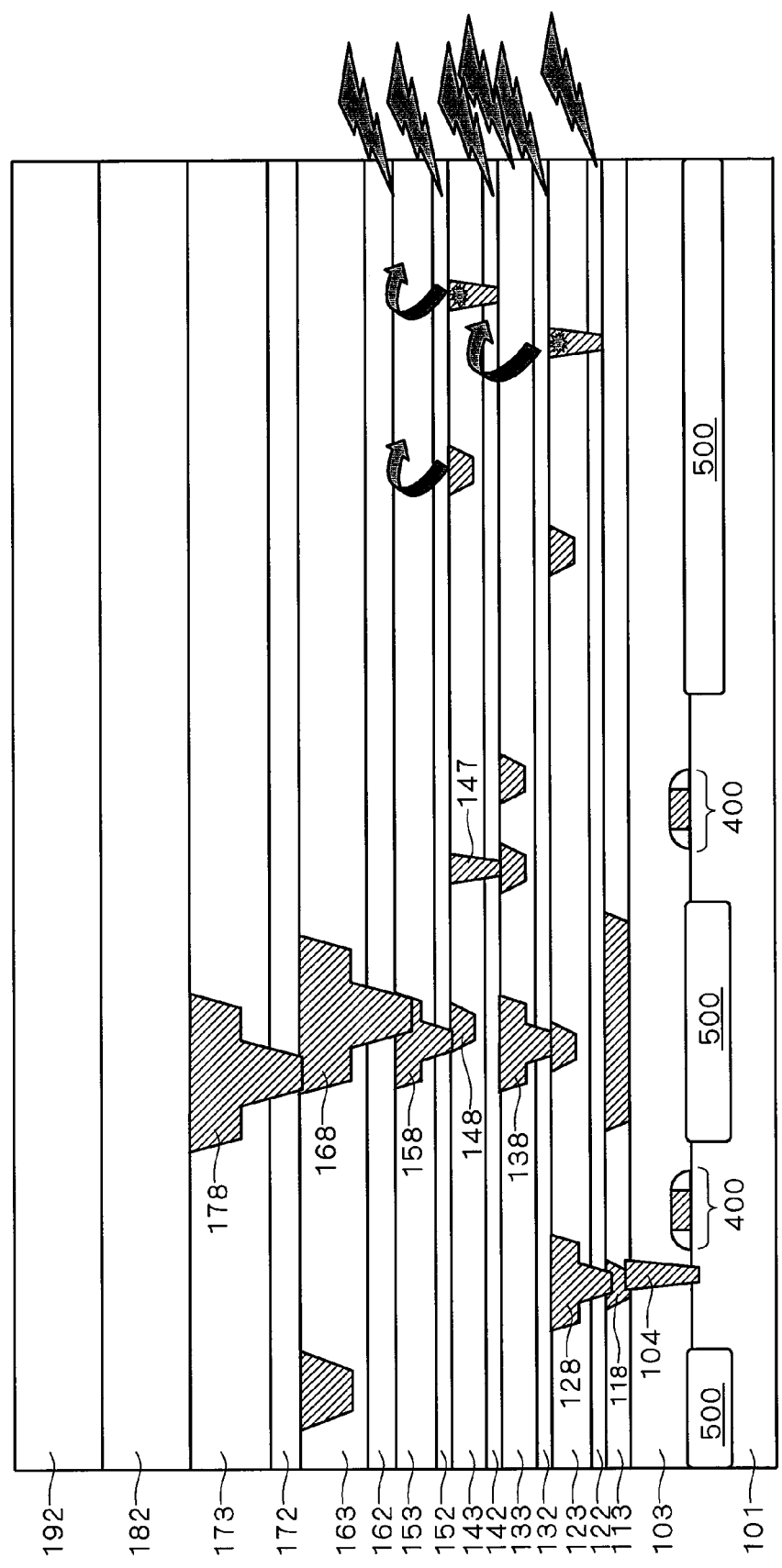
FIGS. 3 and 4 are cross sectional diagrams showing the structures of the semiconductor wafer in comparison.

FIG. 3 is a cross sectional diagram showing, in comparison with FIG. 1, the structure in the case where the films ranging from the first interlayer film 113 to the fifth interlayer film 153 are not removed from the wafer edge portion. In this case, as described above, there is a problem of reduced yield or the like, because the films ranging from the first interlayer film 113 to the fifth interlayer film 153 may peel off from the wafer edge portion during an inline process (e.g., interlayer film CMP or Cu/Ta CMP) after the lamination, or because foreign matter resulting from the process, such as slurry residues after polishing, may exist in areas of the wafer edge portion where no plating is applied.

Figure 4:
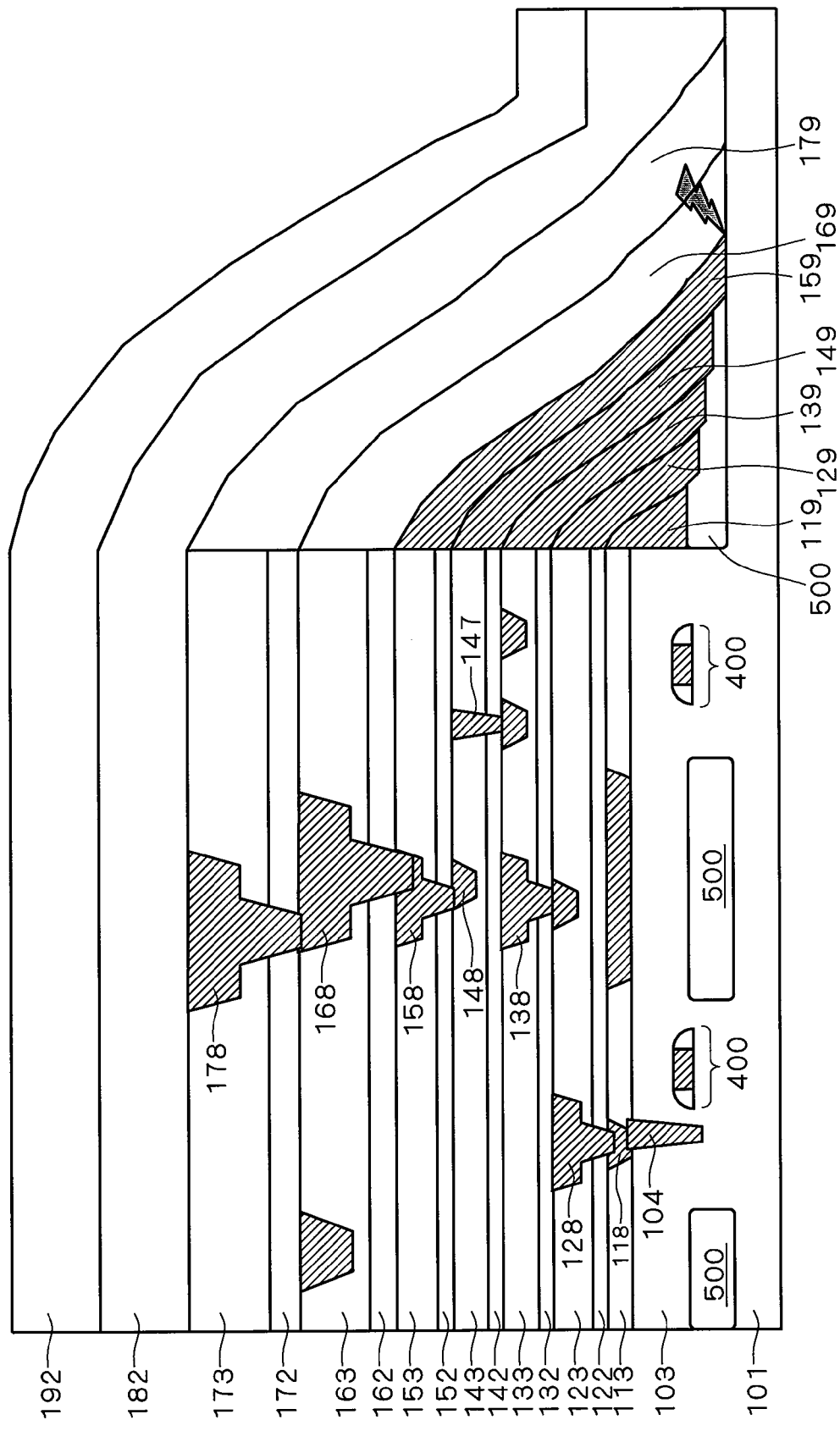

FIG. 4 is a cross sectional diagram showing, in comparison with FIG. 3, the structure in the case where the films ranging from the contact interlayer film 103 to the fifth interlayer film 153 are removed from the wafer edge portion (i.e., the case where the contact interlayer film 103 is removed from the wafer edge portion, in comparison with FIG. 1). In this case, there is, as described above, a problem that the films may peel off due to direct deposition of a barrier metal, e.g., Ta, on the silicon substrate 101 in the Cu process.

In other words, the structure in FIG. 1 according to the present preferred embodiment is characterized in that the films ranging from the first interlayer film 113 to the fifth interlayer film 153 are removed from the wafer edge portion, but the contact interlayer film 103 is not removed therefrom so as to avoid the problems with the structures in FIGS. 3 and 4.

Figure 5:
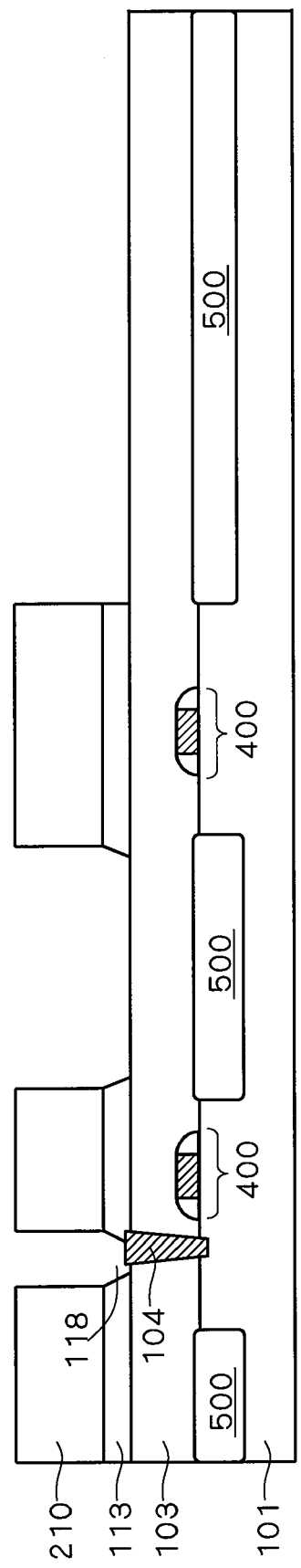
FIGS. 5 to 9 are cross sectional diagrams each showing one step in a manufacturing method for a semiconductor device according to the first preferred embodiment.
Figure 6:
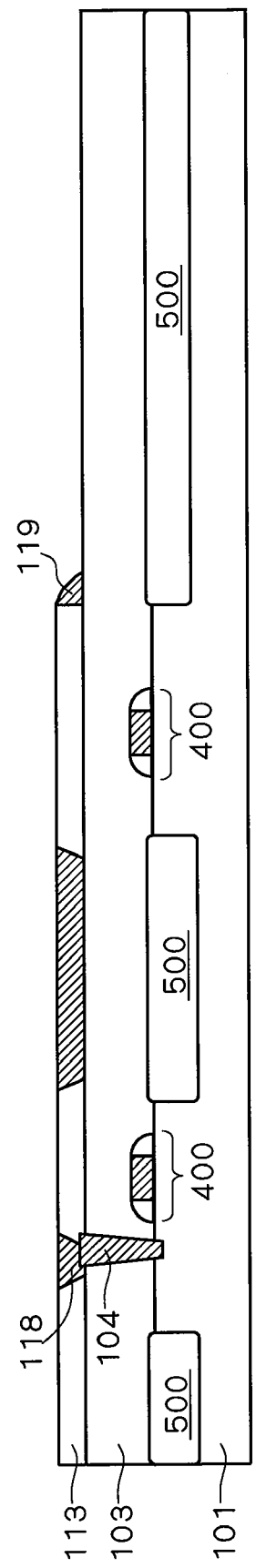
Figure 7:
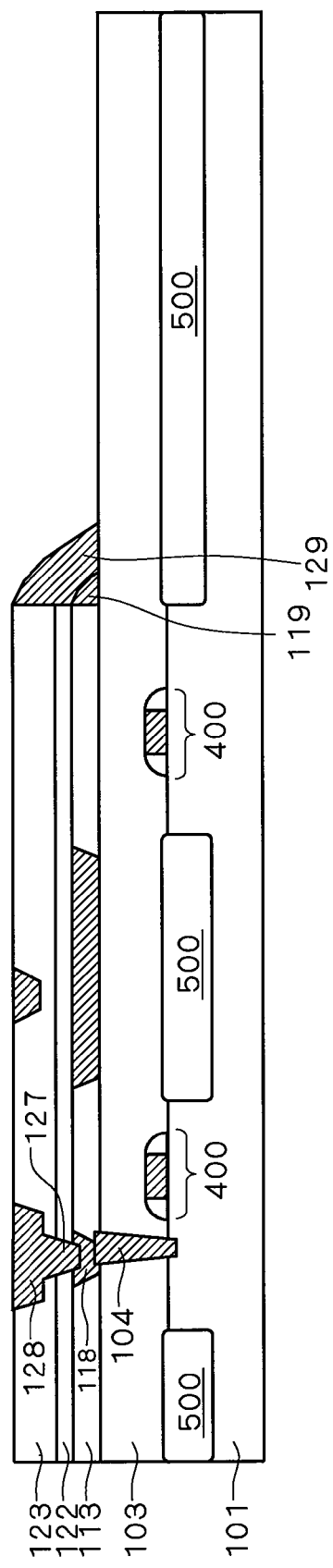
Figure 8:
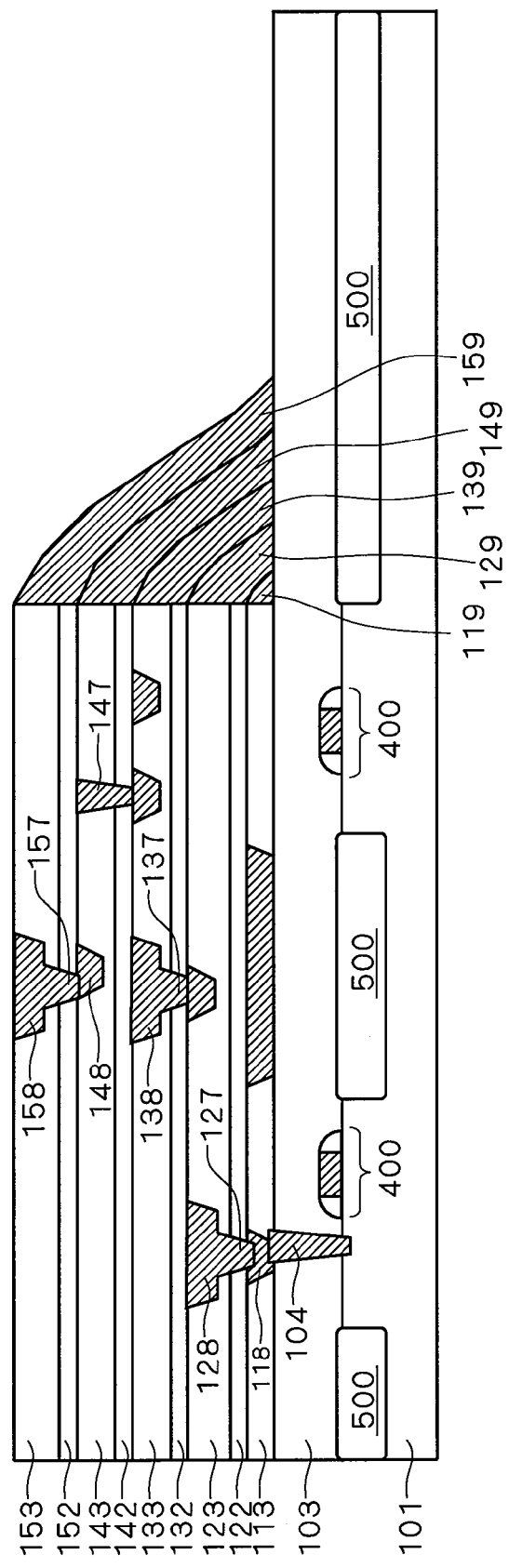
Figure 9:
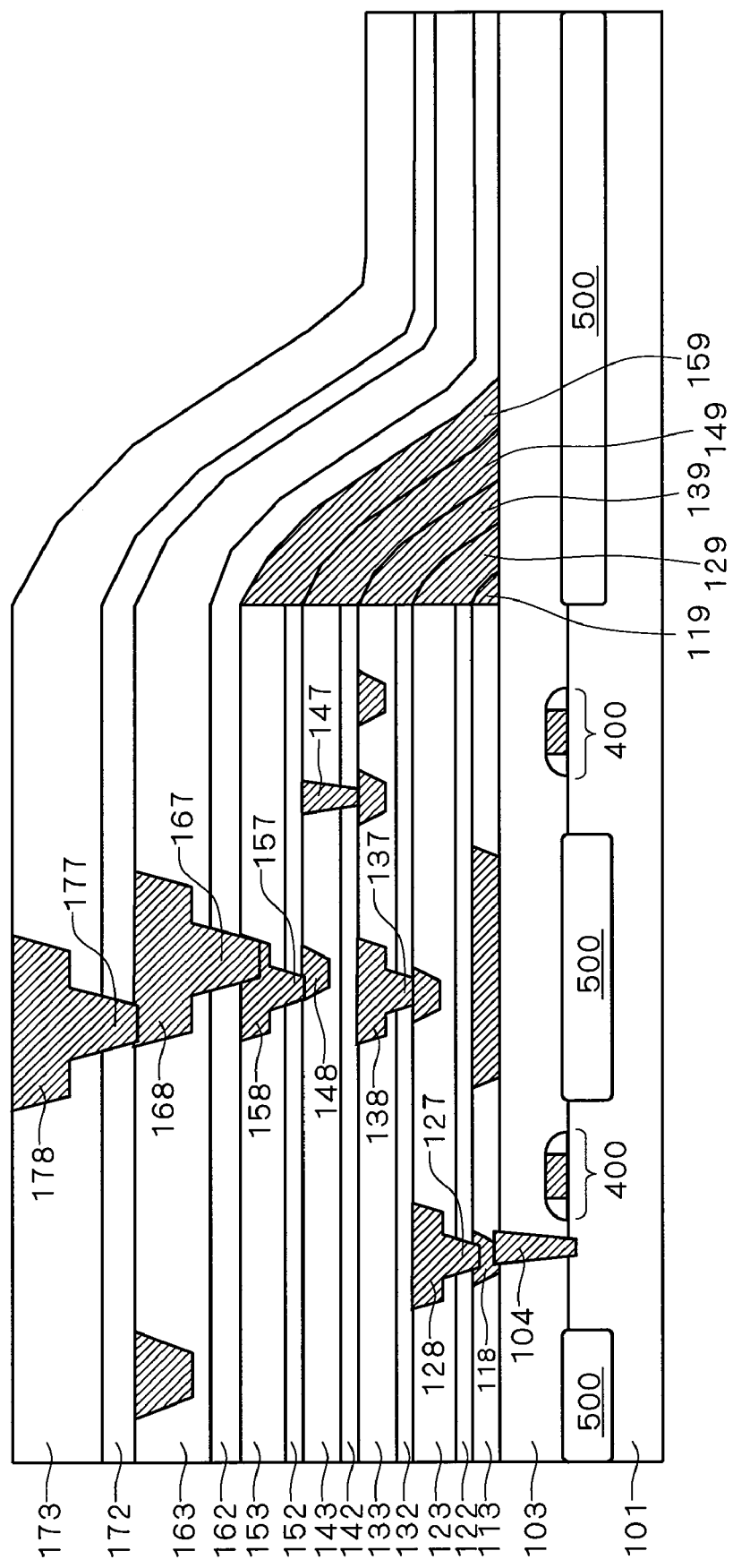

FIGS. 5 to 9 are cross sectional diagrams showing the steps in the manufacturing method for a semiconductor device. FIGS. 5 and 6 show the steps in a single damascene (SD) procedure, and FIGS. 7 to 9 show the steps in a dual damascene (DD) procedure.

First, as shown in FIG. 5, the trench isolation film 500 is formed on the silicon substrate 101, as a semiconductor substrate provided, by STI. Next, the gate structures 400 including a gate insulating film, a gate electrode, and sidewalls provided on both sides of the gate electrode are formed in active regions isolated by the trench isolation film 500. Then, a silicon oxide film such as USG is deposited to 500 nm so as to cover the silicon substrate 101 and are then etched by 100 nm by CMP (chemical mechanical polishing), which provides the contact interlayer film 103 having a thickness of 400 nm. The contact plug 104 is then formed to penetrate through the contact interlayer film 103, for example by forming a contact hall by dry etching using, for example, a 0.10-μm-diameter resist mask and depositing a contact barrier metal laminate film of a 20-nm thick TiN film and a 20-nm thick Ti film and a W plug having a thickness of 200 nm in sequence by CVD (chemical mechanical planarization) and then subjecting them to CMP.

At this time, the contact interlayer film 103 is not removed from the wafer edge portion by peripheral exposure to light.

Then, a first interlayer film 113 is formed of, for example, an SiOC film (k to 2.8) to a thickness of 150 nm. Subsequent patterning by lithography using a resist 210 and subsequent peripheral exposure of, for example, 3.0 mm to light provide an interconnection pattern for the first interconnect layer 118.

Then, as shown in FIG. 6, a barrier metal is formed of, for example, 15-nm thick Ta; and a copper (Cu) interconnect line is formed by depositing a Cu seed to 50 nm by sputtering for example, and then depositing Cu to 500 nm by plating; and then the copper and the barrier metal are polished by CMP, which provides the first interconnect layer 118. At this time, since Cu remains in a sidewall form in the wafer edge portion, the first Cu residue 119 is formed simultaneously in a ring form at a position 3.0 mm away from the outer periphery of the wafer. The first interlayer film 113 is then polished to a thickness of 150 to 100 nm by CMP.

Then, as shown in FIG. 7, the second liner film 122 of, for example, a p-SiC film (k to 4.8) having a thickness of 50 nm is formed on the first interlayer film 113 by CVD. Then, the second interlayer film 123 of, for example, an SiOC film (k to 2.8) having a thickness of 300 nm is formed on the second liner film 122 by CVD.

Then, a via is formed by subsequent dry etching after patterning using a resist mask. At this patterning, the resist mask is also removed from the wafer edge portion by peripheral exposure to light during lithography of the first via 127.

Then, a filling material is buried in the via formed. The second interlayer film 123 is then dry etched and ashed and the second liner film 122 is dry etched, which provides an interconnection pattern for the second interconnect layer 128. At this liner etching, the second liner film 122 is also removed simultaneously from the wafer edge portion.

A barrier metal is then formed of 15-nm thick Ta by sputtering, for example; and a copper (Cu) interconnect line is formed by depositing a Cu seed to 50 nm by sputtering for example and then by depositing Cu to 500 nm by plating; and further the copper and the barrier metal are polished by CMP, which provides the second interconnect layer 128. At this time, since Cu remains in a sidewall form in the wafer edge portion, the second Cu residue 129 is formed simultaneously in a ring form, for example at a position 3.0 mm away from the outer periphery of the wafer.

Hereinafter, the same steps as described above, i.e., the steps from the formation of the first interlayer film 113 to the formation of the second interconnect layer 128, are repeated.

As a result, as shown in FIG. 8, the third liner film 132, the third interlayer film 133, the third interconnect layer 138, and the third Cu residue 139; the fourth liner film 142, the fourth interlayer film 143, the fourth interconnect layer 148, and the fourth Cu residue 149; the fifth liner film 152, the fifth interlayer film 153, the fifth interconnect layer 158, and the fifth Cu residue 159 are formed in the order given in the same manner as the second liner film 122, the second interlayer film 123, the second interconnect layer 128, and the second Cu residue 129 are formed. This provides the Fine layer whose wafer edge portion is removed by peripheral exposure to light during lithography in the via process (the process of forming a first via 127, a second via 137, a third via 147, and a fourth via 157).

Next, as shown in FIG. 9, the sixth liner film 162, the sixth interlayer film 163, and the sixth interconnect layer 168; and the seventh liner film 172, the seventh interlayer film 173, and the seventh interconnect layer 178 are formed in the order given on top of the Fine layer. This provides a semi-global layer that is not removed from the wafer edge portion. Through those steps described above, the semiconductor wafer shown in FIG. 1 is manufactured. This semiconductor wafer is cut into a plurality of semiconductor devices through dicing, and subsequent packaging completes the manufacture of the semiconductor devices.

As described above, in the semiconductor wafer and the manufacturing method for a semiconductor device according to the present preferred embodiment, the films ranging from the first interlayer film 113 to the fifth interlayer film 153 are removed from the wafer edge portion. This prevents the films ranging from the first interlayer film 113 to the fifth interlayer film 153 from peeling off from the wafer edge portion during the lamination, or prevents the occurrence of foreign matter resulting from the process (such as slurry residues after polishing) in areas of the wafer edge portion where no plating is applied, or prevents the occurrence of a pattern error due to out-of-focusing, i.e., defocusing, during exposure to light, thus preventing a reduction in yield.

The non-removal of the contact interlayer film 103 from the wafer edge portion prevents peeling-off of films due to direct deposition of the barrier metal on the silicon substrate 101.

In other words, the semiconductor wafer and the manufacturing method for a semiconductor device according to the present preferred embodiment prevent peeling-off of films and pattern skipping in the wafer edge portion.

While the above description provides the case where the first interlayer film 113, the second interlayer film 123, and the like are formed of an SiOC film (k to 2.8), the invention is not limited thereto; those interlayer films may be formed of a ULK film (k to 2.5), an ELK film (k to 2.2), a spin-coated porous MSQ film (k to 2.2), or a laminated film of those films.

Further, while the above description provides the case where the second liner film 122, the third liner film 132, and the like are formed of a p-SiC film (k to 4.8), the invention is not limited thereto; those liner films may be formed of a p-SiCO film, a p-SiCN film, a p-SiN film, or a laminated film of those films. Alternatively, the structure may be such that no liner film is provided below the interconnect lines.

Further, while the above description provides the case where the barrier metal is formed of only Ta (a single Ta layer film), the invention is not limited thereto; the barrier metal may be formed of TaN or TiN, or of an oxide or a nitride of Ta, Ti, Ru or Mn, or of a laminated film of those films.

Further, while the above description provides the case where the peripheral exposure to light is performed in the single-layer resist 210, the invention is not limited thereto; the peripheral exposure to light may be performed in a middle layer by following a multilayer resist procedure using a carbon hard mask, or it may be performed in a middle layer using a resist in upper layers. This allows improved resolution.

Further, while the above description provides the case where the width to which each layer is removed from the wafer edge portion by peripheral exposure to light (hereinafter the width is referred to as a "wafer-edge rinse width") is 3.0 mm, the invention is not limited thereto, and the wafer-edge rinse width may be in the range of 0.1 to 5.0 mm.

Further, while the above description provides the case where the removal of films from the wafer edge portion is done by peripheral exposure to light, the invention is not limited thereto; the removal may be done by rinsing of the edge, washing of the rear surface with an etchant, bevel polishing, or dry etching or ashing using a bevel etcher.

The above description provides the structure where the Fine layer that includes Low-k ($k \leq 3.0$) films is removed from the wafer edge portion and the semi-globe layer that includes no Low-k ($k \leq 3.0$) film is not removed from the wafer edge portion. The invention is, however, not limited thereto; the semi-global layer may be removed from the wafer edge portion when it includes Low-k ($k \leq 3.0$) films.

Figure 10:
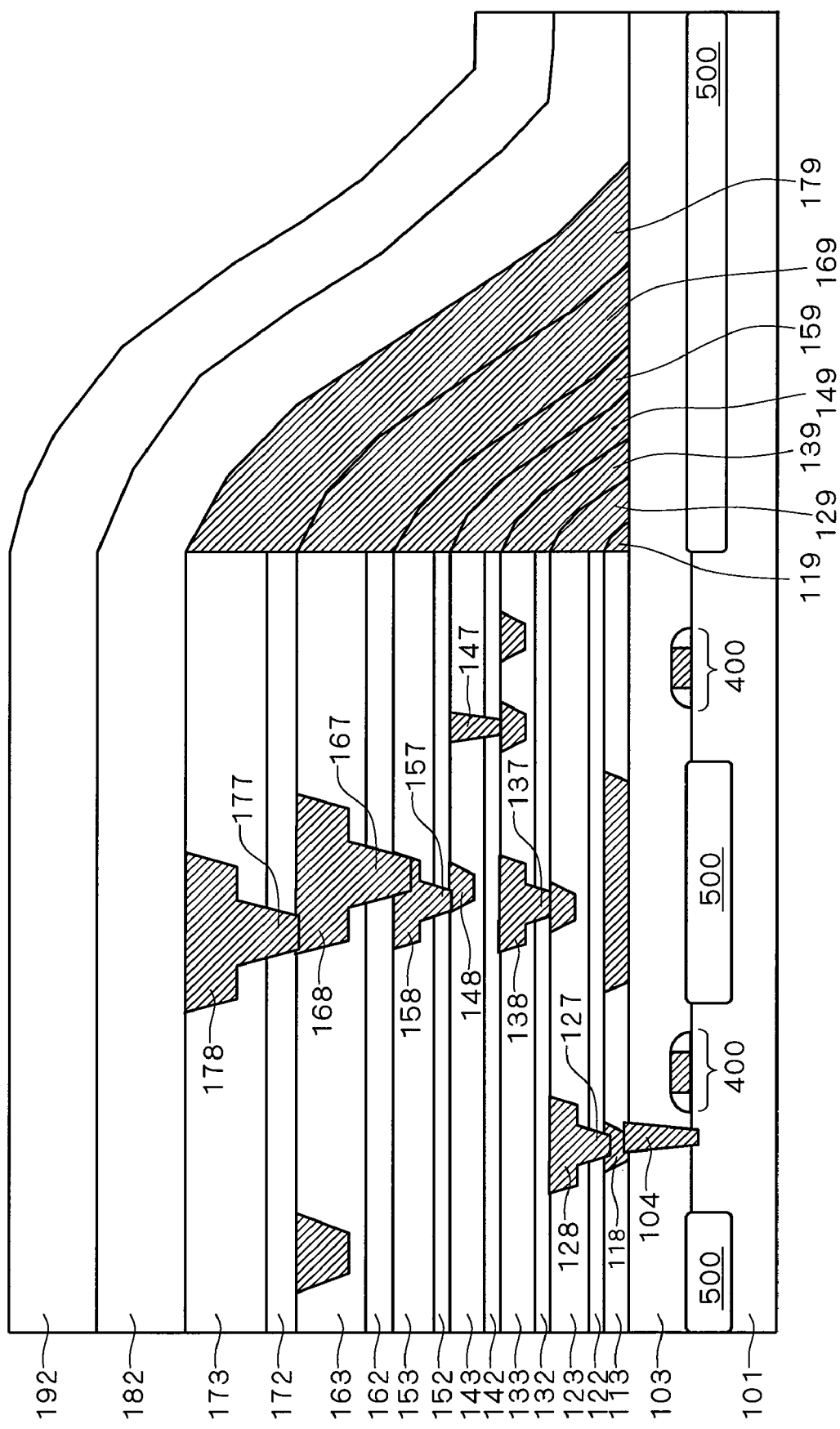
FIG. 10 is a cross sectional diagram showing the structure of the semiconductor wafer according to the first preferred embodiment.

FIG. 10 shows the case where the semi-global layer in FIG. 1 including the sixth liner film 162, the sixth interlayer film 163, the seventh liner film 172, and the seventh interlayer film 173 includes Low-k ($k \leq 3.0$) films so that it is removed from the wafer edge portion.

Figure 11:
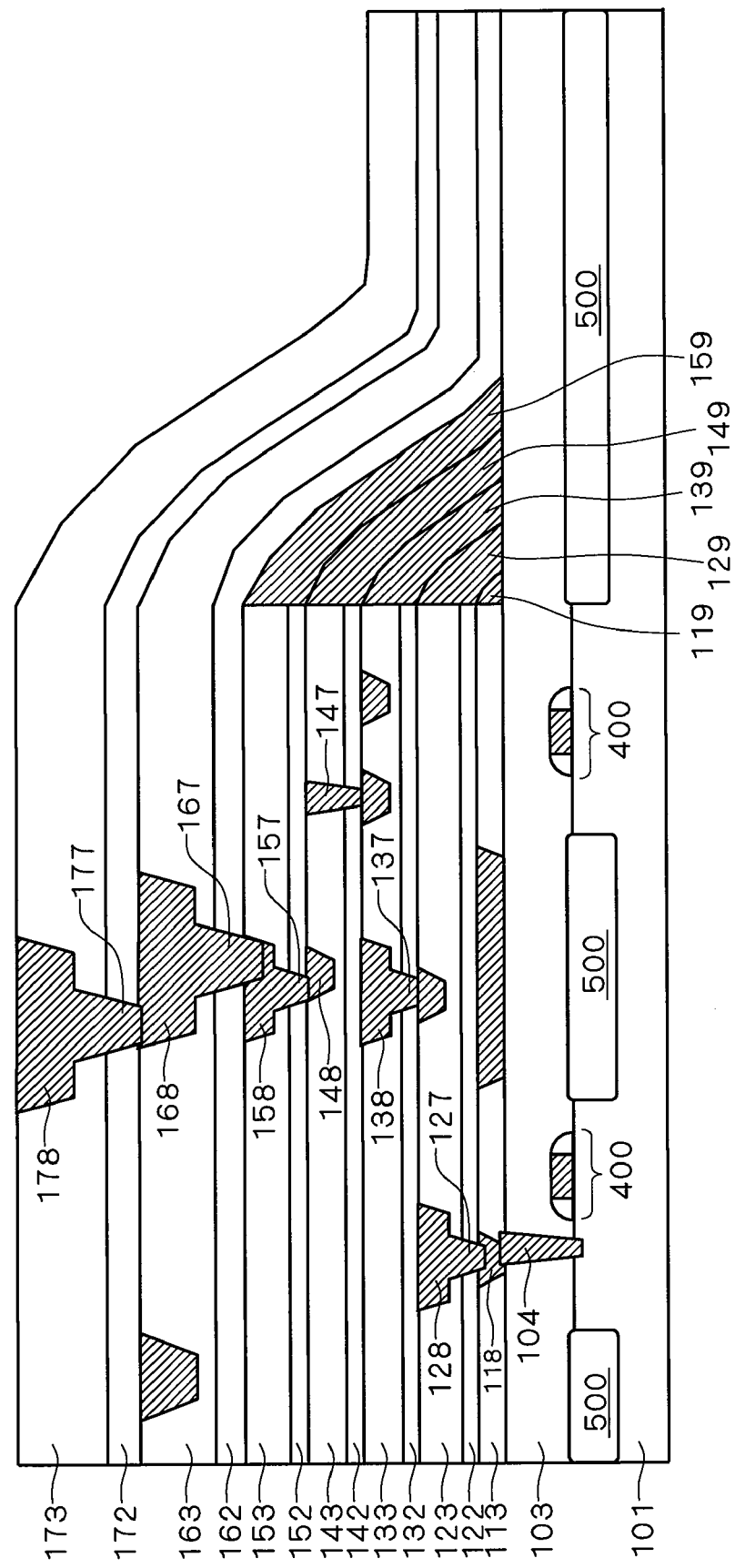
FIG. 11 is a cross sectional diagram showing one step in the manufacturing method for a semiconductor device according to the first preferred embodiment.

FIG. 11 is a cross sectional diagram showing one step in a manufacturing method for the semiconductor device in FIG. 10. After completion of the steps in FIGS. 5 to 8, as shown in FIG. 11, the semi-global layer is removed from the wafer edge portion by peripheral exposure to light during lithography in the via process (the process of forming the fifth via 167 and the sixth via 177), which provides a copper (Cu) interconnect line. As a result, a sixth Cu residue 169 and a seventh Cu residue 179 are formed in a ring form, for example at a position 3.0 mm away from the outer periphery of the wafer, so as to cover the fifth Cu residue 159.

While the above description provides the case where the removal of films from the wafer edge portion is done through the dual damascene procedure, it may be done through a single damascene (SD) procedure instead of the dual damascene procedure.

Figure 12:
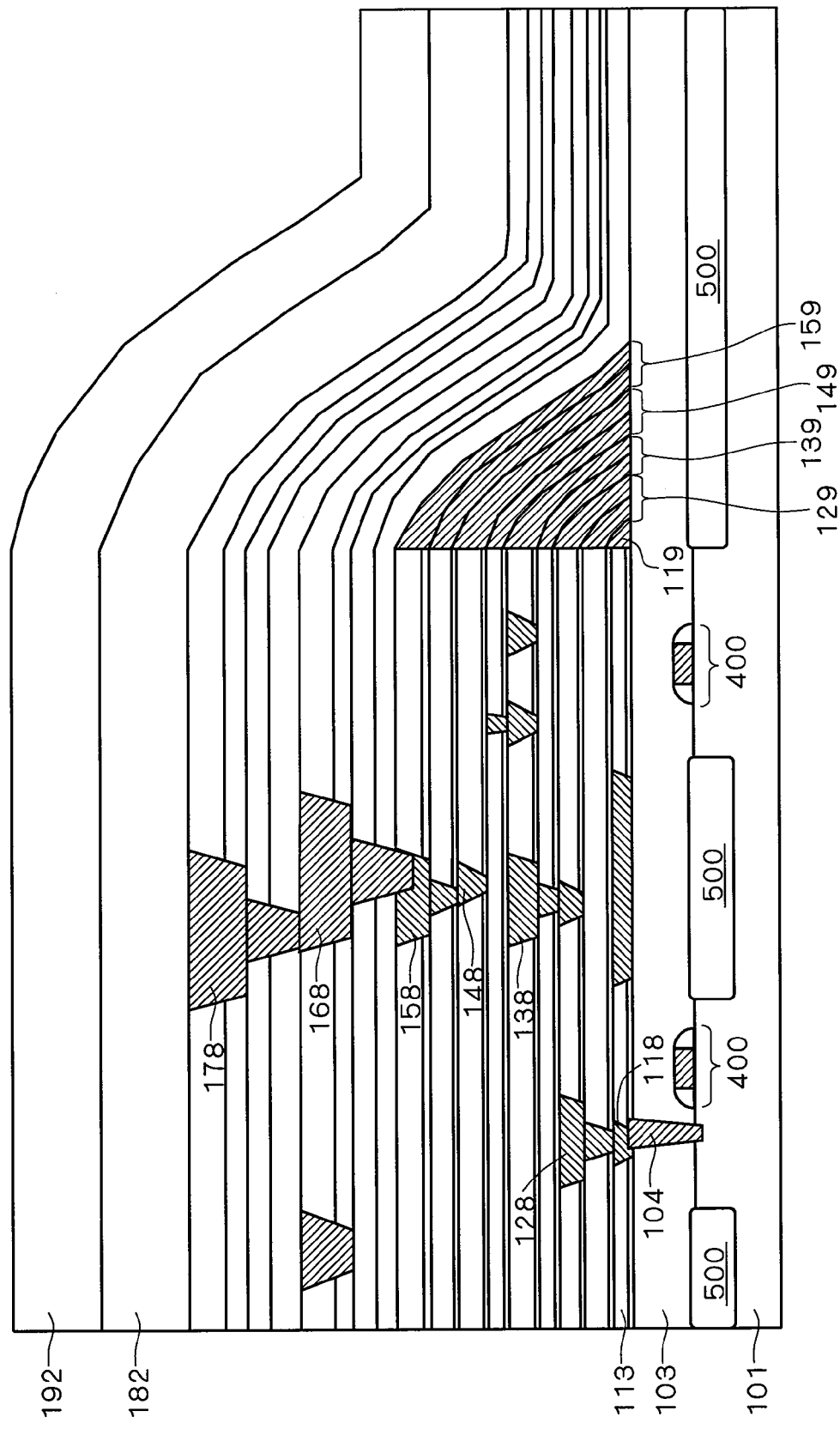
FIG. 12 is a cross sectional diagram showing the structure of the semiconductor wafer according to the first preferred embodiment.
Figure 13:
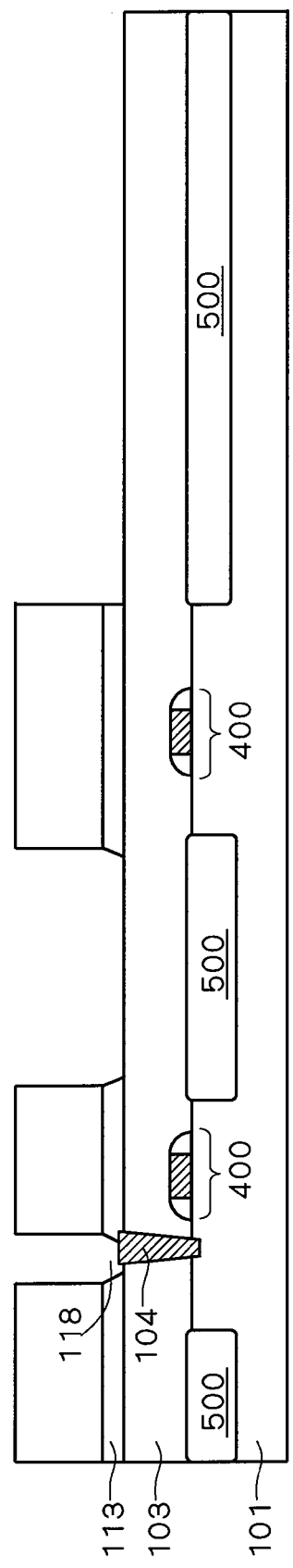
FIGS. 13 to 18 are cross sectional diagrams each showing one step in the manufacturing method for a semiconductor device according to the first preferred embodiment.
Figure 14:
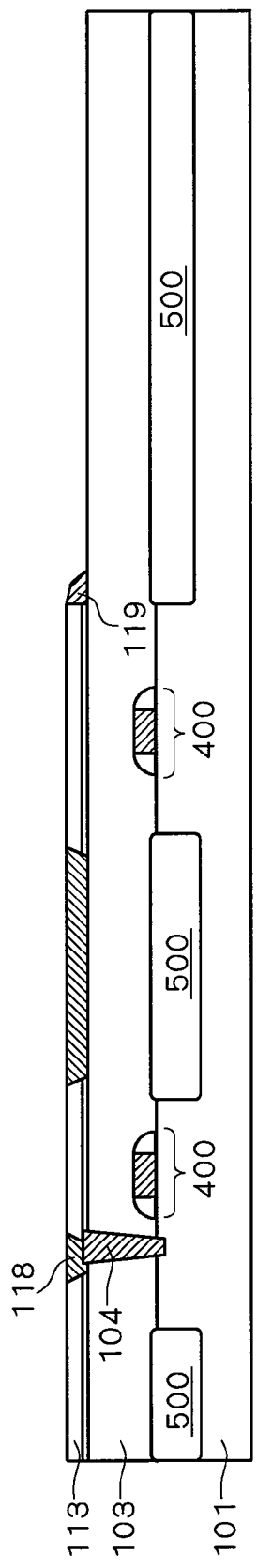
Figure 15:
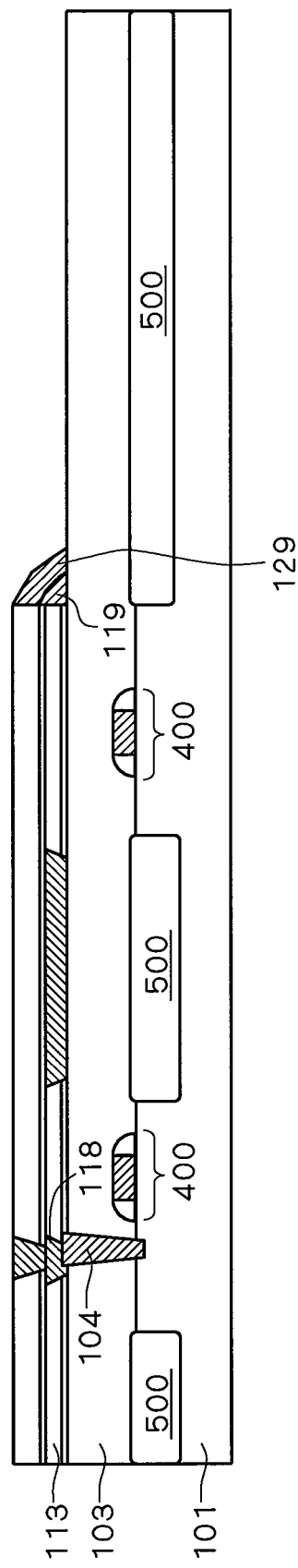
Figure 16:
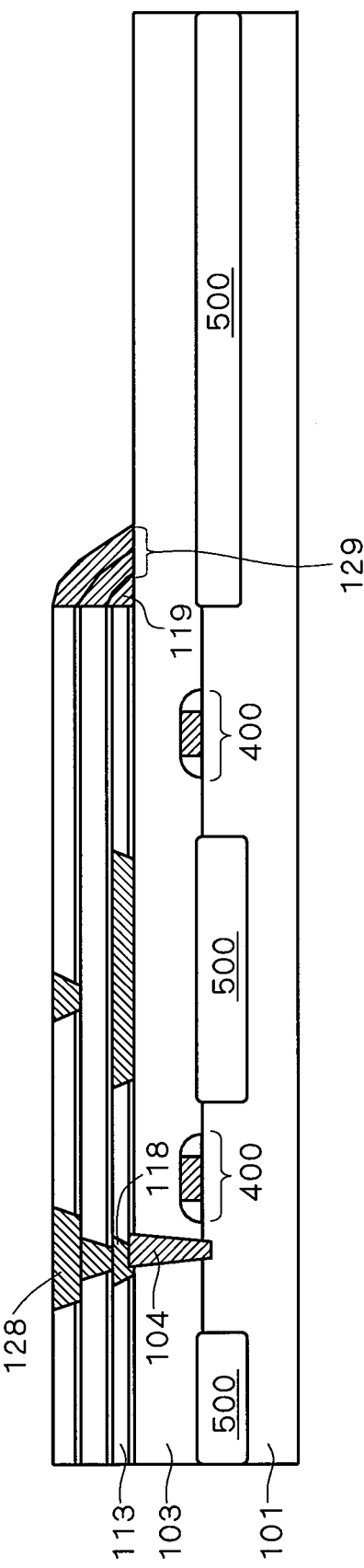
Figure 17:
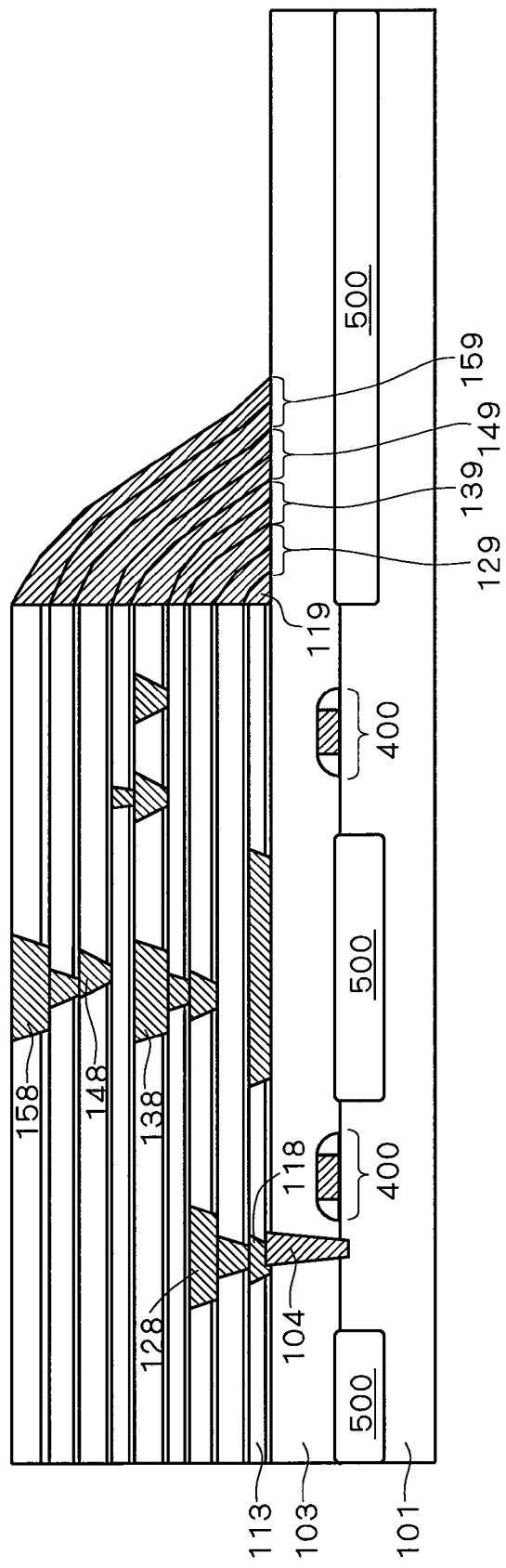
Figure 18:
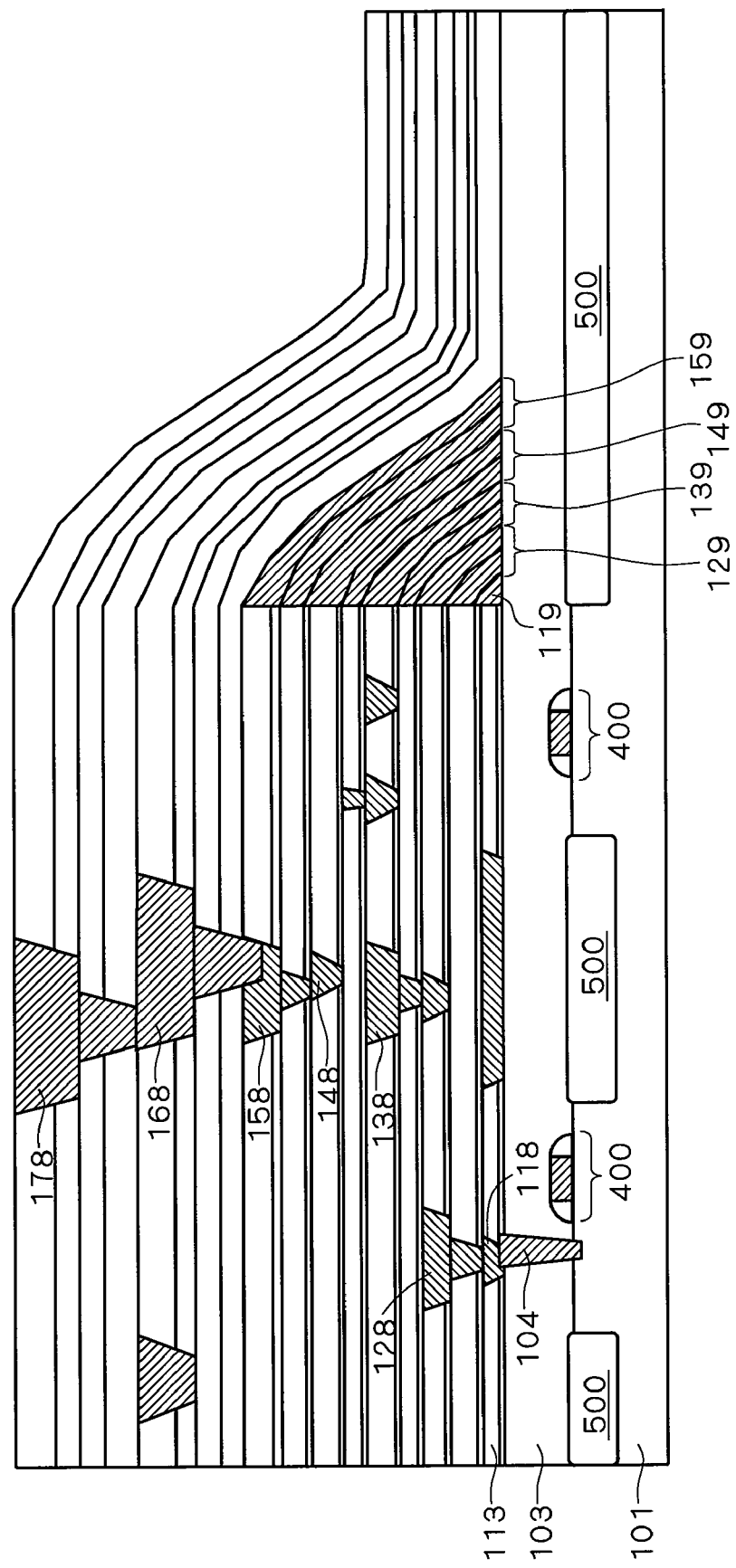

FIG. 12 is a cross sectional diagram showing, in comparison with FIG. 1, the structure in the case of using the single damascene procedure instead of the dual damascene procedure. FIGS. 13 to 18 are cross sectional diagrams showing the steps in a manufacturing method for the semiconductor device in FIG. 12. Specifically, FIG. 13 corresponds to FIG. 5, FIG. 14 corresponds to FIG. 6, FIGS. 15 and 16 correspond to FIG. 7, FIG. 17 corresponds to FIG. 8, and FIG. 18 corresponds to FIG. 9, all of which illustrate almost the same steps so that the detailed description thereof is omitted. As shown in FIGS. 15 and 16, the vias and the interconnect lines are formed by different processes in the single damascene procedure.

That is to say, in the dual damascene procedure, as described above in reference to FIG. 7, a single interlayer film is formed on a single liner film, and the via patterns and the interconnection patterns are formed in sequence, and the vias and the interconnect lines are formed by one process. The interlayer films, which are not covered with a resist mask, are removed from the wafer edge portion at the formation of the via patterns, while the liner films, which are covered with a resist mask, are not removed from the wafer edge portion at the formation of the interconnection patterns, but they are removed from the wafer edge portion at the same time when they are etched in a subsequent process.

In the single damascene procedure, on the other hand, as shown in FIG. 15, a single via interlayer film is formed on a single via liner film, and the via patterns are formed to form (deposit) vias; and then, as shown in FIG. 16, a single interconnect interlayer film is formed on a single interconnect liner film, and the interconnection patterns are formed to form (deposit) interconnect lines. In the single damascene procedure, unlike in the dual damascene procedure, as shown in FIG. 15, the via liner films and the via interlayer films, which are not covered with a resist mask, are removed from the wafer edge portion at the formation of the via patterns, while, as shown in FIG. 16, the interconnect liner films and the interconnect interlayer films, which are not covered with a resist mask, are removed from the wafer edge portion at the formation of the interconnection patterns.

Due to limitations of space, FIG. 12 or other drawings which illustrates the single damascene procedure shows some of the interlayer films in the multilayer interconnection structure without reference numerals nor characters; those films correspond to the films ranging from the second liner film 122 to the seventh interlayer film 173 in FIG. 1 or other drawings which illustrates the dual damascene procedure, and they are formed through the single damascene procedure, instead of the dual damascene procedure.

Second Preferred Embodiment

The first preferred embodiment, as shown in FIG. 10, provides the case where each layer in both the Fine layer and the semi-global layer is equally removed from the wafer edge portion by 3.0-mm peripheral exposure to light. The invention is, however, not limited thereto; the wafer-edge rinse width may differ from layer to layer in the Fine layer and in the semi-global layer.

Figure 19:
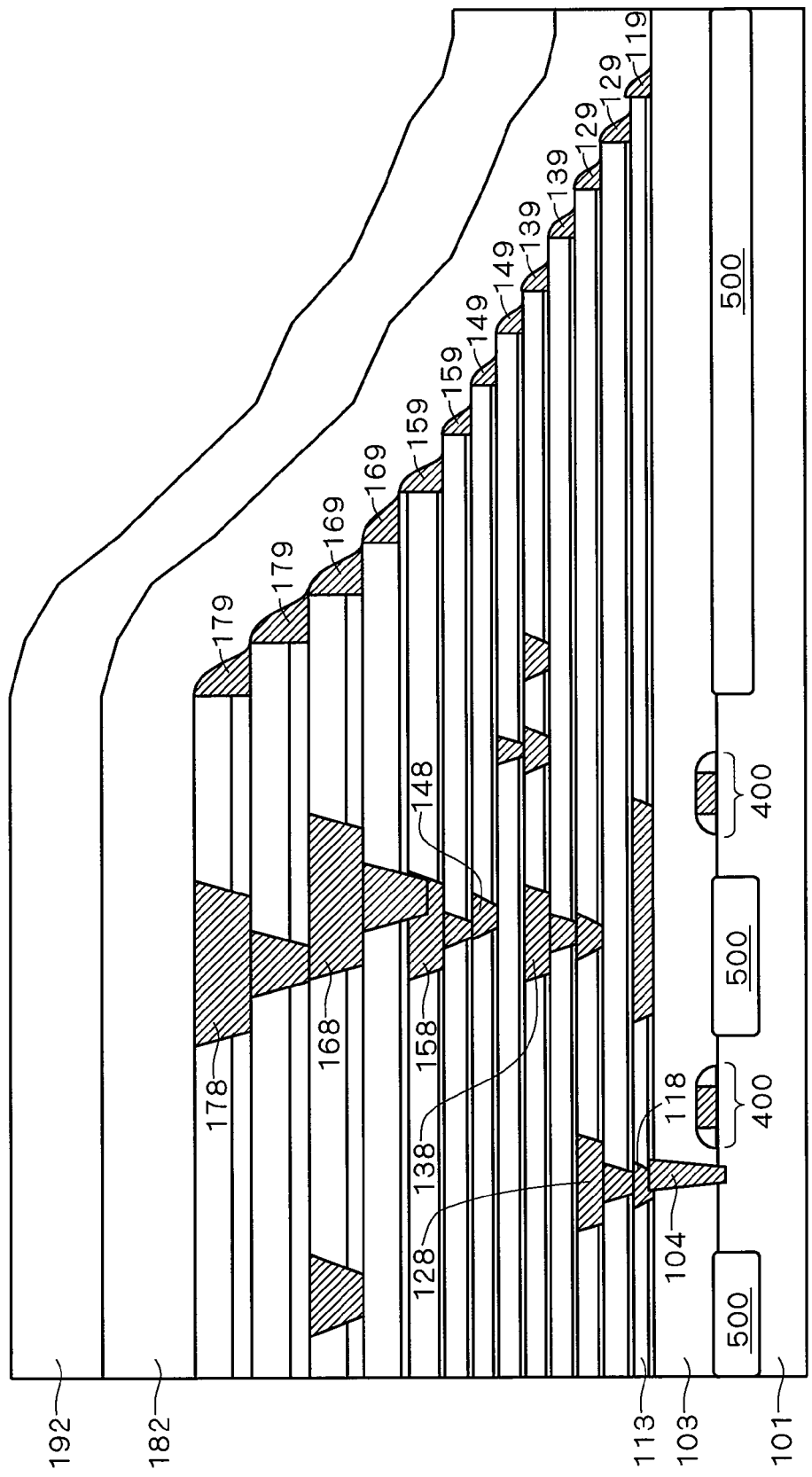
FIG. 19 is a cross sectional diagram showing the structure of a semiconductor wafer according to a second preferred embodiment.
Figure 20:
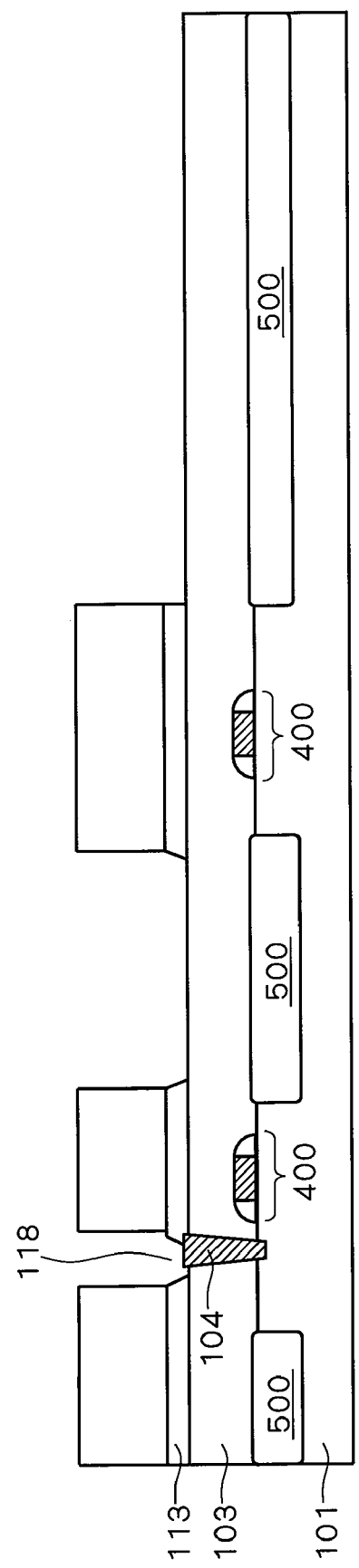
FIGS. 20 to 25 are cross sectional diagrams each showing one step in a manufacturing method for a semiconductor device according to the second preferred embodiment.
Figure 21:
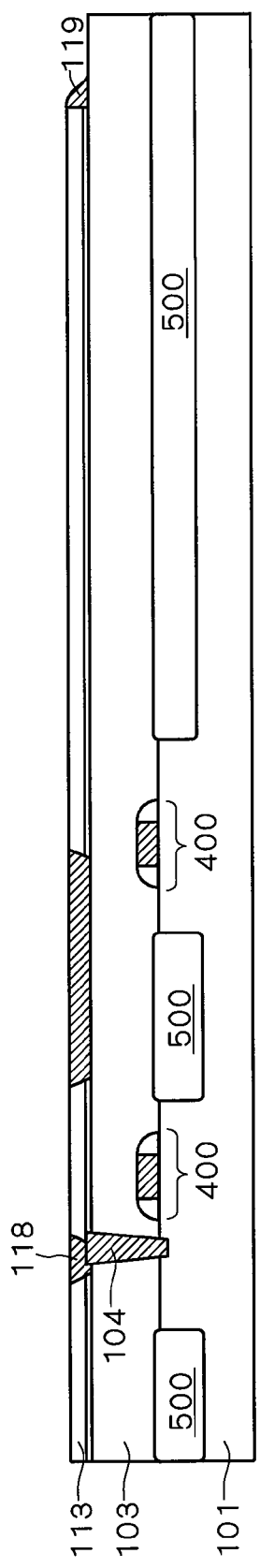
Figure 22:
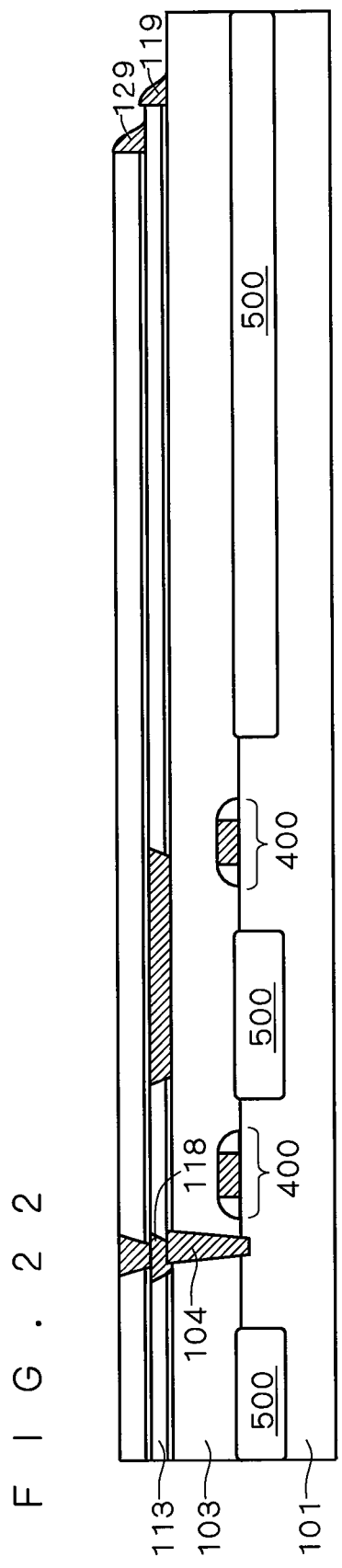
Figure 23:
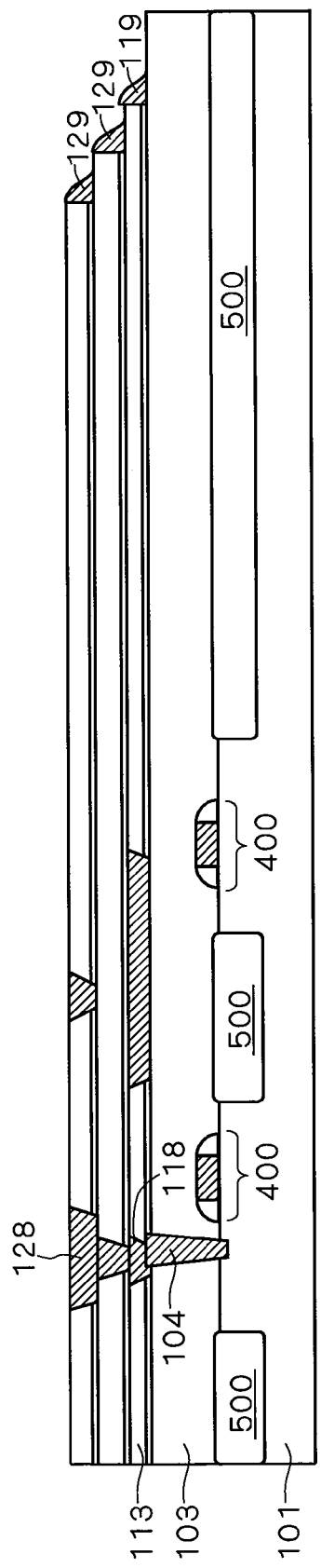
Figure 24:
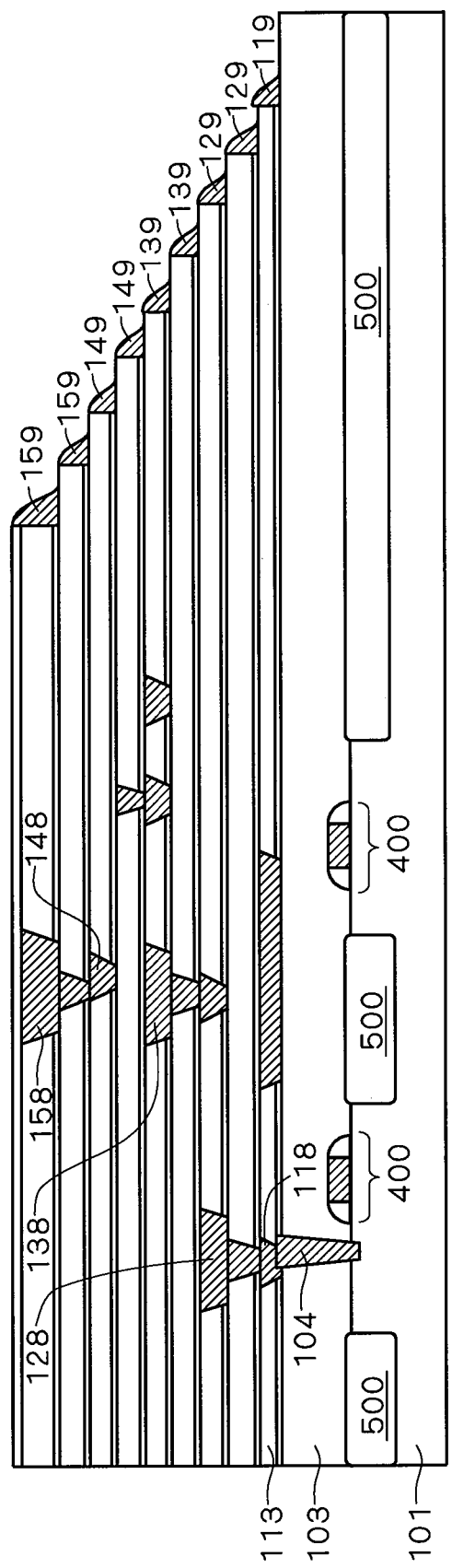
Figure 25:
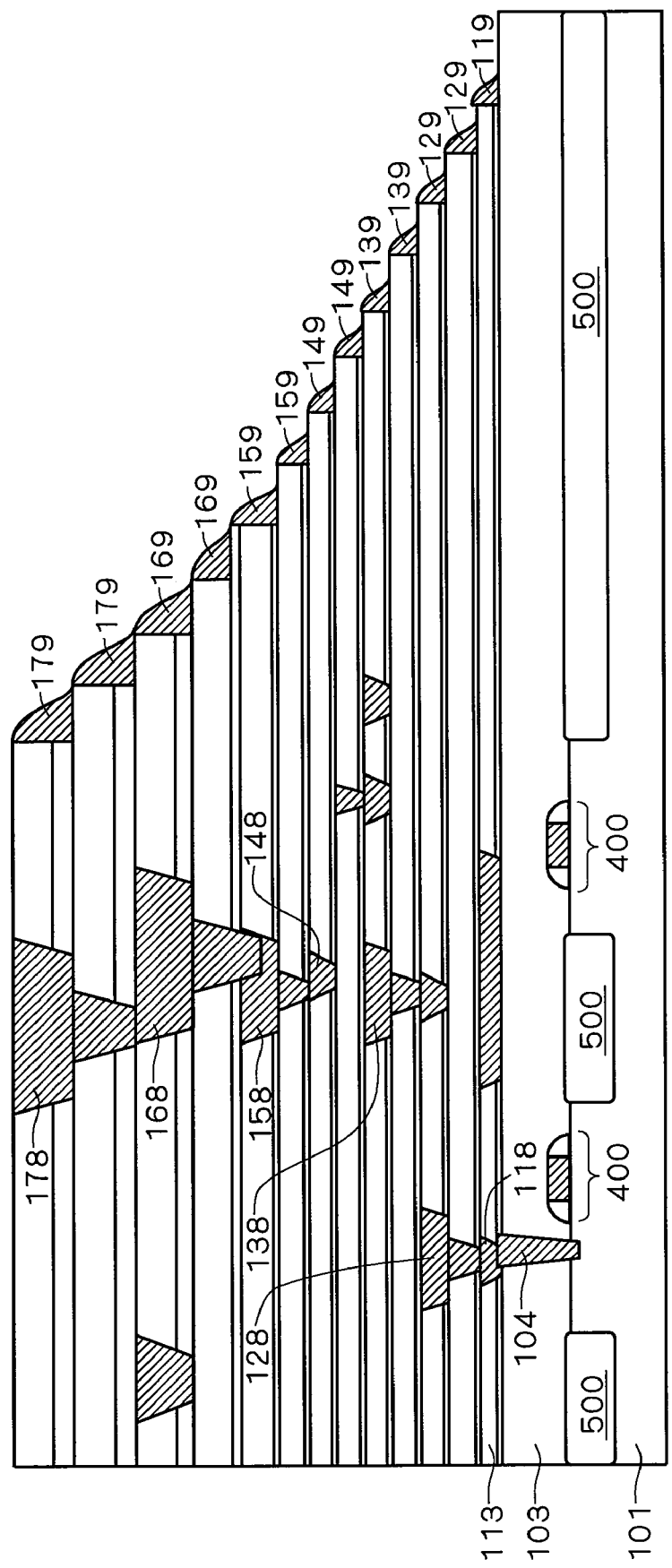

FIG. 19 is a cross sectional diagram showing the structure of a semiconductor wafer according to a second preferred embodiment. Like FIG. 12, FIG. 19 shows the case where the single damascene procedure is employed instead of the dual damascene procedure and the wafer-edge rinse width increases toward the upper layers in the Fine layer and in the semi-global layer. To be more specific, the wafer-edge rinse width increases in 0.1 mm increments toward the upper layers in such a manner that the wafer-edge rinse width for the first layer is 1.5 mm, that for the second layer is 1.6 mm, and so on.

FIGS. 20 to 25 are cross sectional diagrams showing the steps in a manufacturing method for the semiconductor device in FIG. 19. FIGS. 20 to 25 correspond to FIGS. 13 to 18, all of which illustrate almost the same steps so that the detailed description thereof is omitted.

The semiconductor wafer and the manufacturing method for a semiconductor device according to the present preferred embodiment, in comparison with those according to the first preferred embodiment, allow a reduction in the amount of Cu residues that remain in a sidewall form in the wafer edge portion, thus preventing pattern skipping. The second preferred embodiment, in comparison with the first preferred embodiment, thus further prevents peeling-off of films and pattern skipping in the wafer edge portion.

Third Preferred Embodiment

The second preferred embodiment provides the case where the wafer-edge rinse width increases toward the upper layers in the Fine layer and in the semi-global layer. The invention is, however, not limited thereto; the wafer-edge rinse width may decrease toward the upper layers in the Fine layer and in the semi-global layer.

Figure 26:
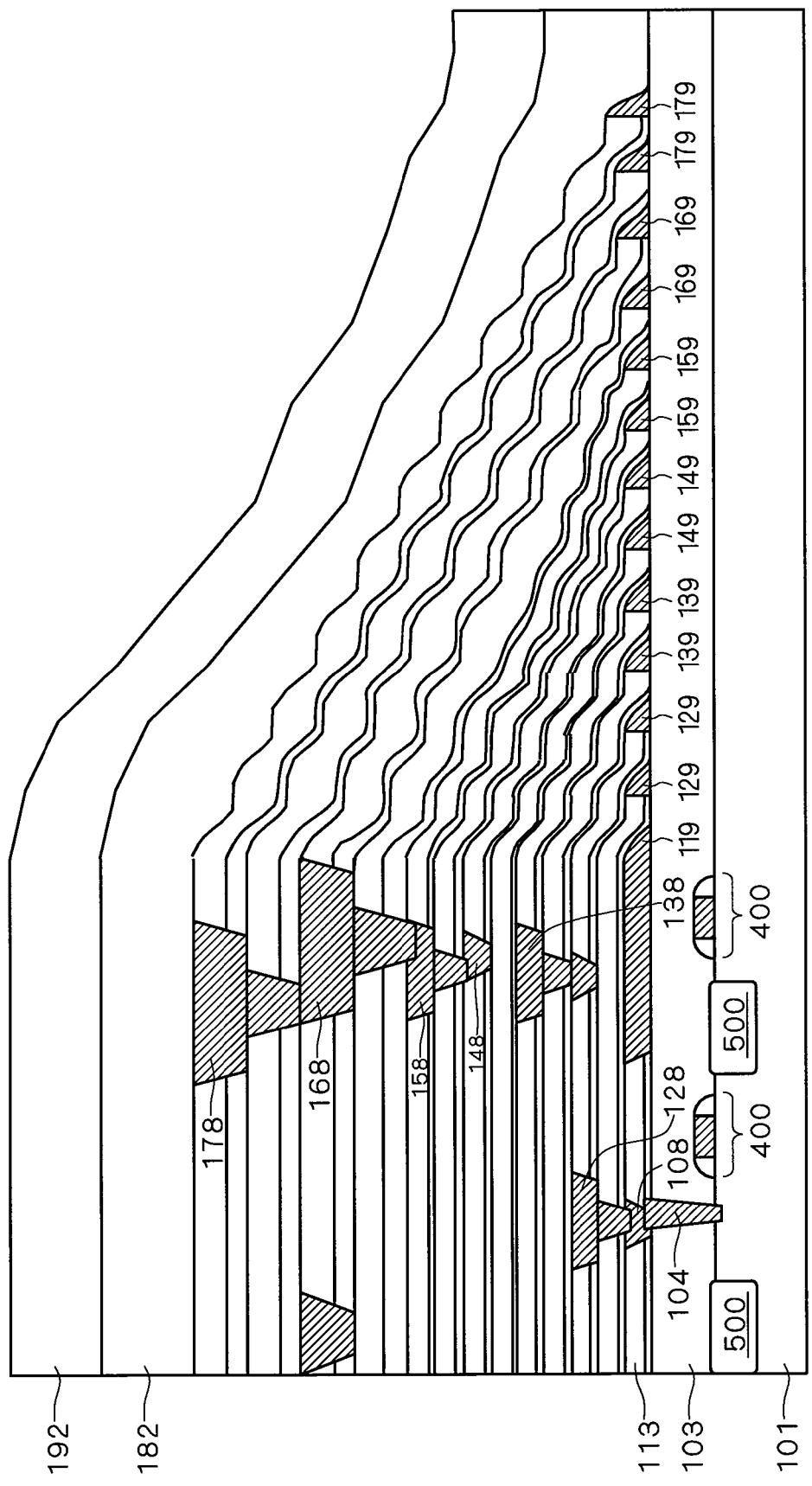
FIG. 26 is a cross sectional diagram showing the structure of a semiconductor wafer according to a third preferred embodiment.
Figure 27:
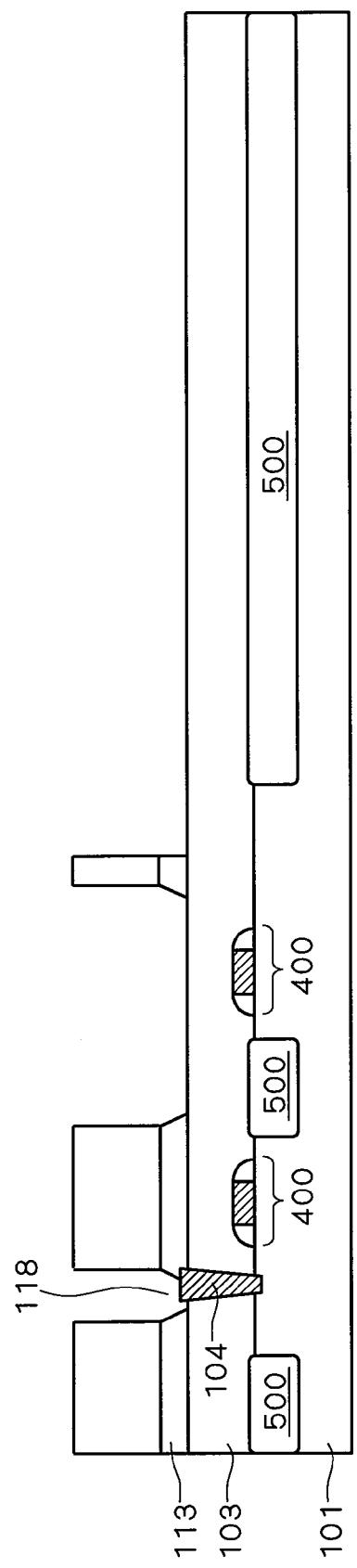
FIGS. 27 to 32 are cross sectional diagrams each showing one step in a manufacturing method for a semiconductor device according to the third preferred embodiment.
Figure 28:
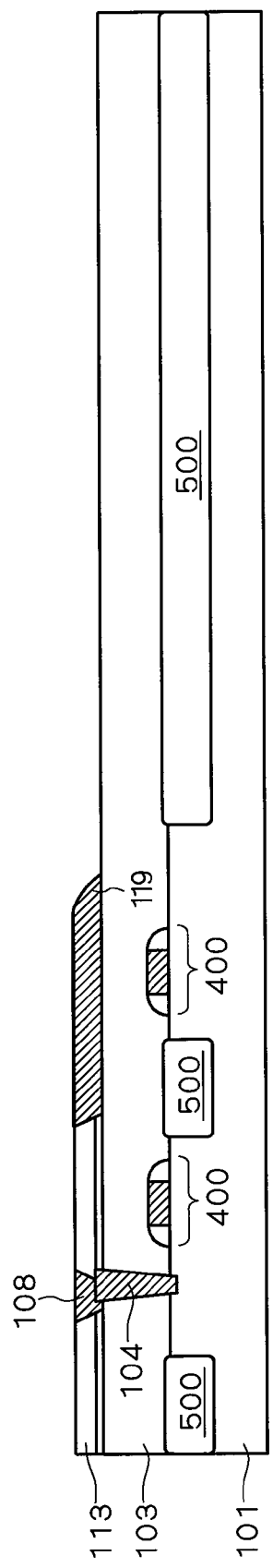
Figure 29:
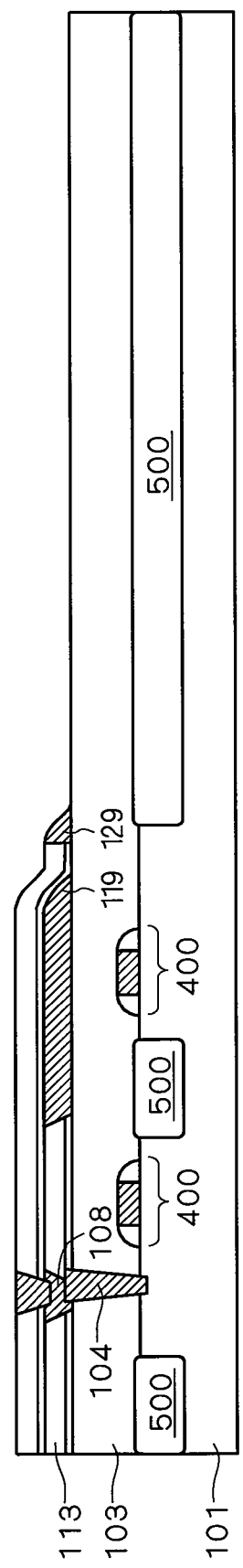
Figure 30:
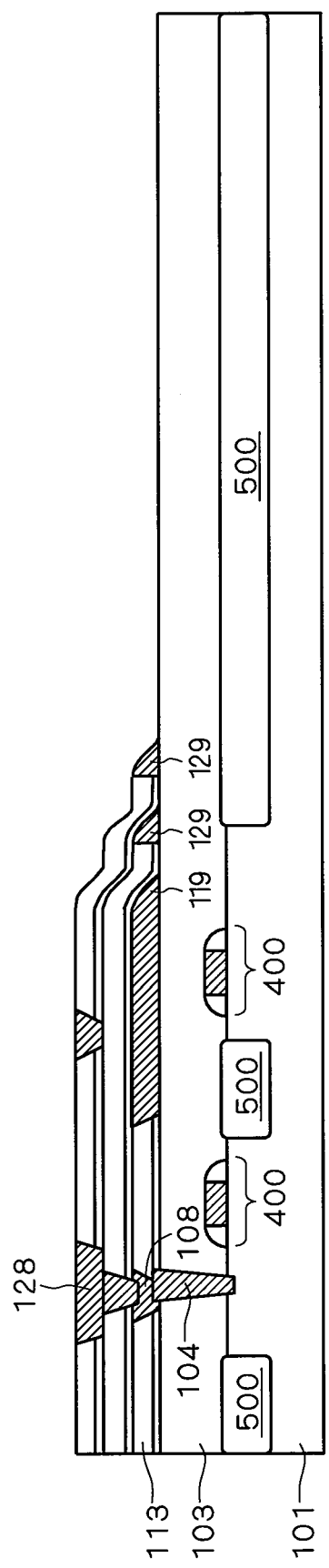
Figure 31:
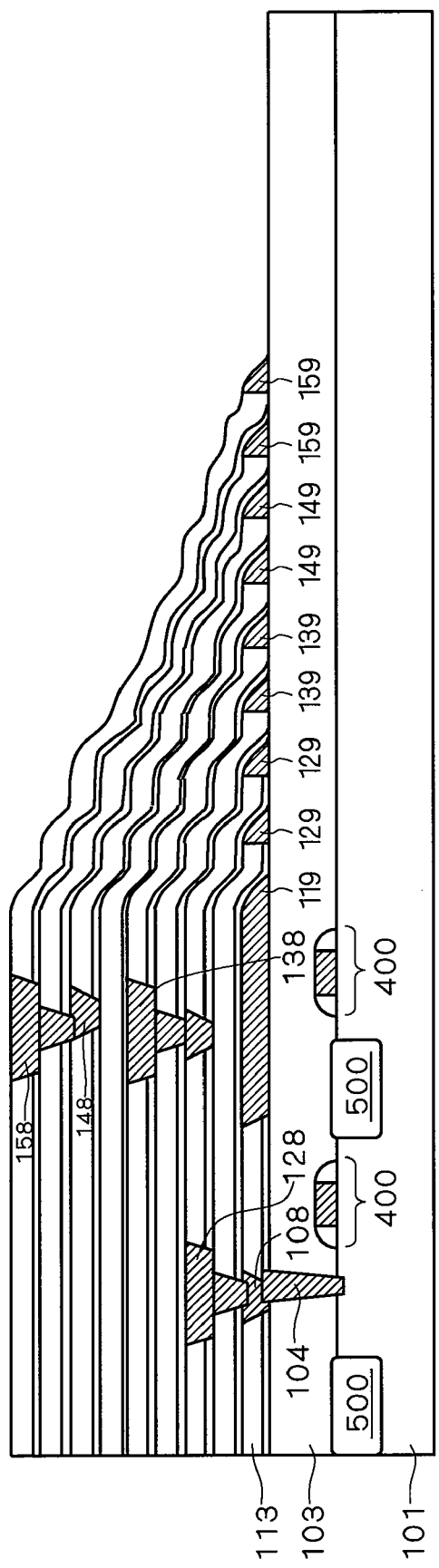
Figure 32:
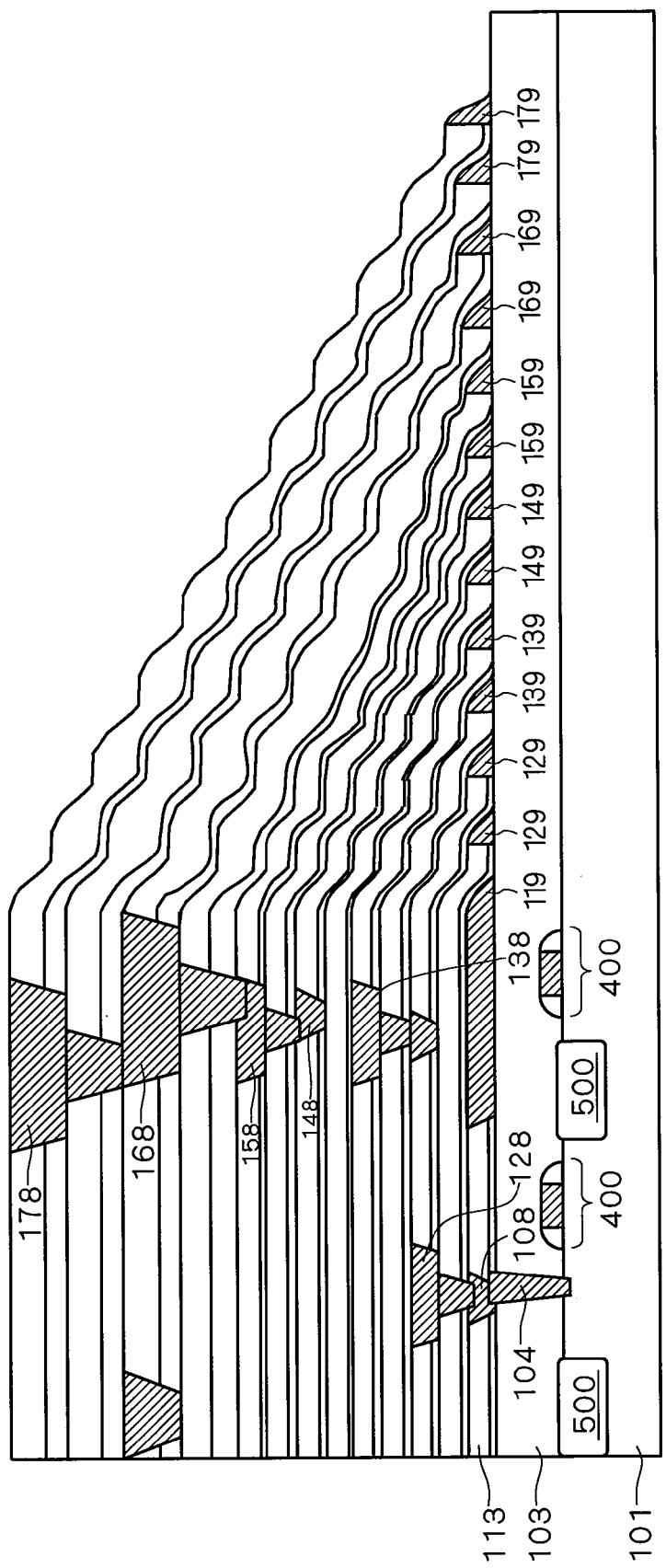

FIG. 26 is a cross sectional diagram showing the structure of a semiconductor wafer according to a third preferred embodiment. FIG. 26 shows, in comparison with FIG. 19, the structure in the case where the wafer-edge rinse width decreases toward the upper layers. To be more specific, the wafer-edge rinse width decreases in 0.1 mm increments toward the upper layers in such a manner that the wafer-edge rinse width for the first layer is 2.5 mm, that for the second layer is 2.4 mm, and so on.

FIGS. 27 to 32 are cross sectional diagrams showing the steps in a manufacturing method for the semiconductor device in FIG. 19. FIGS. 27 to 32 correspond to FIGS. 20 to 25, all of which illustrate almost the same steps so that the detailed description thereof is omitted.

The semiconductor wafer and the manufacturing method for a semiconductor device according to the present preferred embodiment, like those in the second preferred embodiment, allow a reduction in the amount of Cu residues that remain in a sidewall form in the wafer edge portion, in comparison with those in the first preferred embodiment.

In addition, in comparison with the second preferred embodiment, the period of time that the Cu residues are exposed during the process of forming the multilayer interconnection structure is shortened. The present preferred embodiment, in comparison with the second preferred embodiment, thus further prevents peeling-off of films and pattern skipping in the wafer edge portion.

Fourth Preferred Embodiment

The second and third preferred embodiments provide the cases where the wafer-edge rinse width differs from layer to layer in the Fine layer and in the semi-global layer. Differentiating the wafer-edge rinse width from layer to layer, however, increases the number of manufacturing recipe types, thus increasing management cost.

Figure 33:
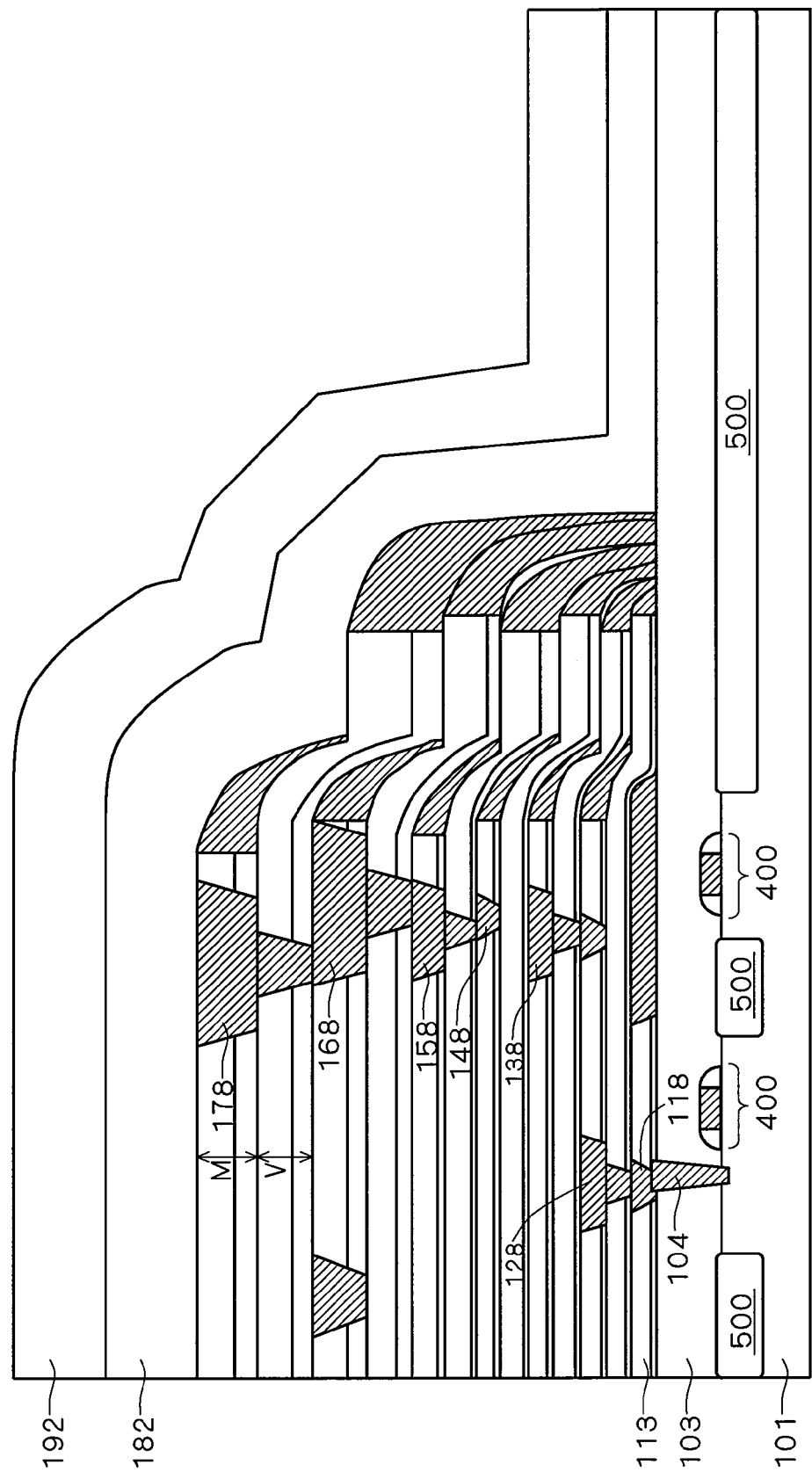
FIG. 33 is a cross sectional diagram showing the structure of a semiconductor wafer according to a fourth preferred embodiment.
Figure 34:
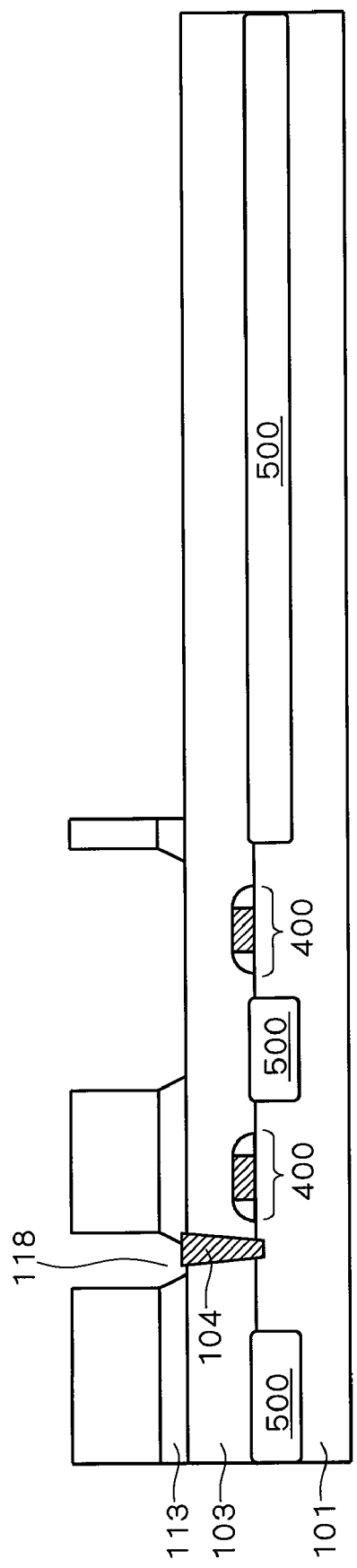
FIGS. 34 to 39 are cross sectional diagrams each showing one step in a manufacturing method for a semiconductor device according to the fourth preferred embodiment.
Figure 35:
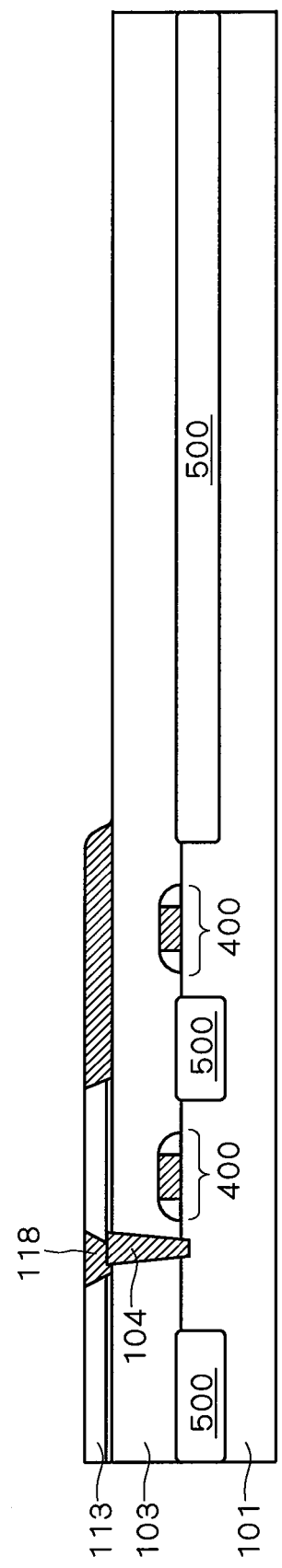
Figure 36:
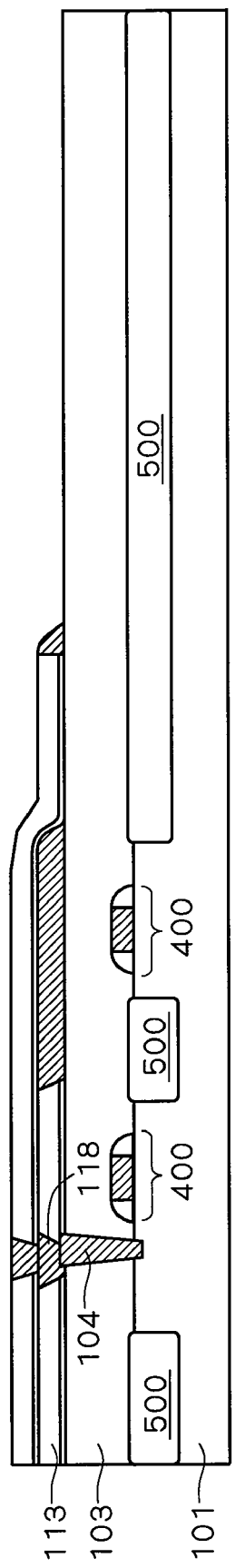
Figure 37:
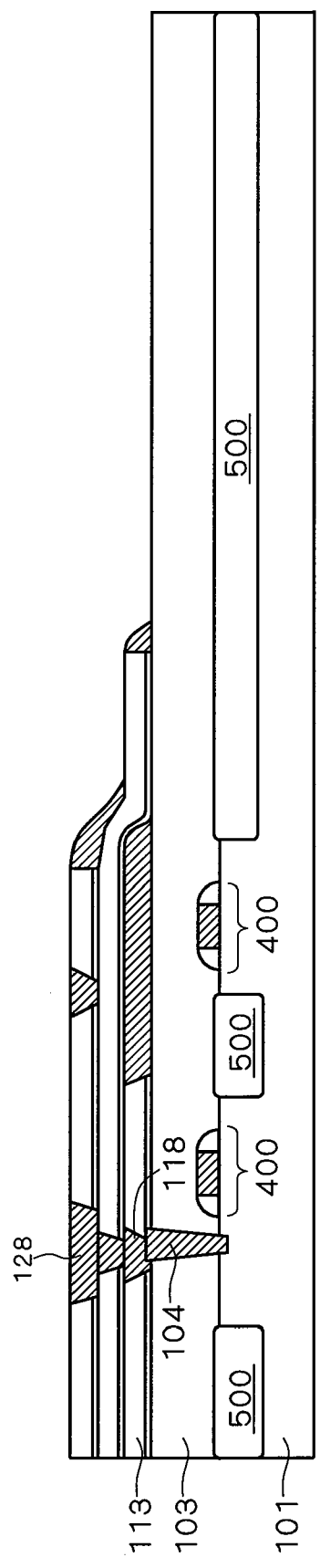
Figure 38:
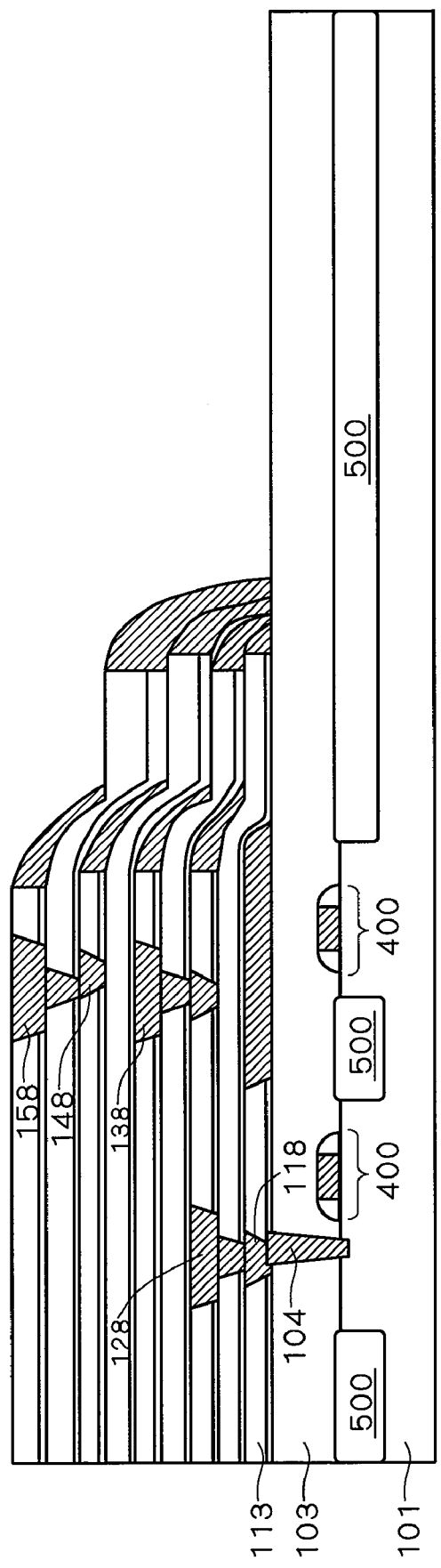
Figure 39:
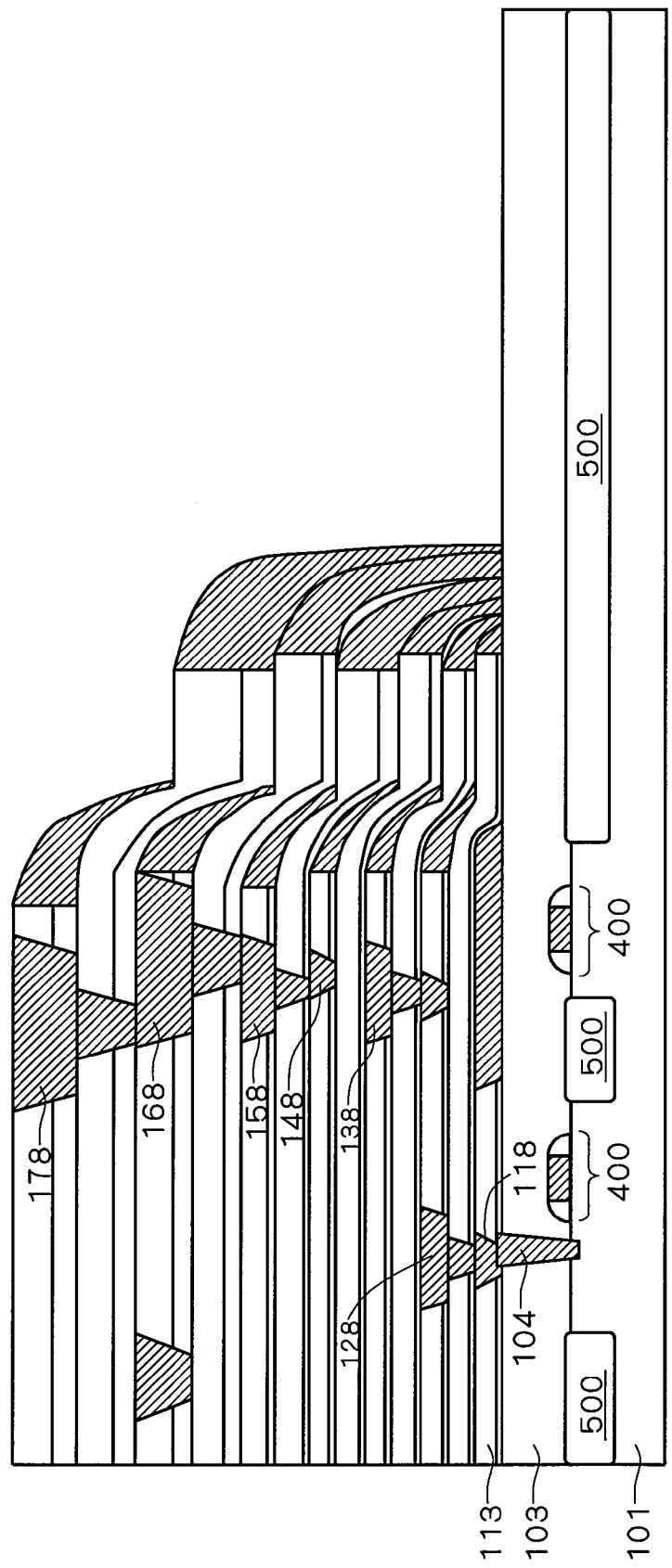

FIG. 33 is a cross sectional diagram showing the structure of a semiconductor wafer according to a fourth preferred embodiment. Unlike FIGS. 19 and 26 which show the case where the wafer-edge rinse width differs from layer to layer, FIG. 33 shows the case where the wafer-edge rinse width differs between first layers (Vx layers, i.e., low-k via interlayer films) where vias are formed in the second interlayer films with dielectric constants of 3.0 or lower; and second layers (Mx layers, i.e., low-k interconnect interlayer films) (Vx layer, that is, low-k via interlayer film) where interconnect lines are formed in the third interlayer films with dielectric constants of 3.0 or lower. More specifically, in the multilayer interconnection structure formed by alternate laminations of Mx layers and Vx layers, the wafer-edge rinse width for the Mx layers is 3.0 mm and the wafer-edge rinse width for the Vx layers is 2.5 mm. Due to limitations of space, FIG. 33 shows, only for the seventh layer where the seventh interconnect layer 178 is formed, the My layer where the interconnect line is formed and the Vy layer where the via is formed.

FIGS. 34 to 39 are cross sectional diagrams showing the steps in a manufacturing method for the semiconductor device in FIG. 33. FIGS. 34 to 39 correspond to FIGS. 20 to 25 or FIGS. 27 to 32, all of which illustrate almost the same steps so that the detailed description thereof is omitted.

The semiconductor wafer and the manufacturing method for a semiconductor device according to the present preferred embodiment, in comparison with those in the second and third preferred embodiments, allow a reduction in the number of manufacturing recipe types, thus reducing management cost.

Fifth Preferred Embodiment

The fourth preferred embodiment provides the case where the wafer-edge rinse width for the M layers is 3.0 mm and the wafer-edge rinse width for the V layers is 2.5 mm, in the Fine layer and in the semi-global layer. However, for example when the M layers include Low-k ($k \leq 3.0$) films and the V layers do not include Low-k ($k \leq 3.0$) films, the wafer-edge rinse width for the M layers should be 3.0 mm, but wafer-edge rinsing of the V layers becomes unnecessary.

Figure 40:
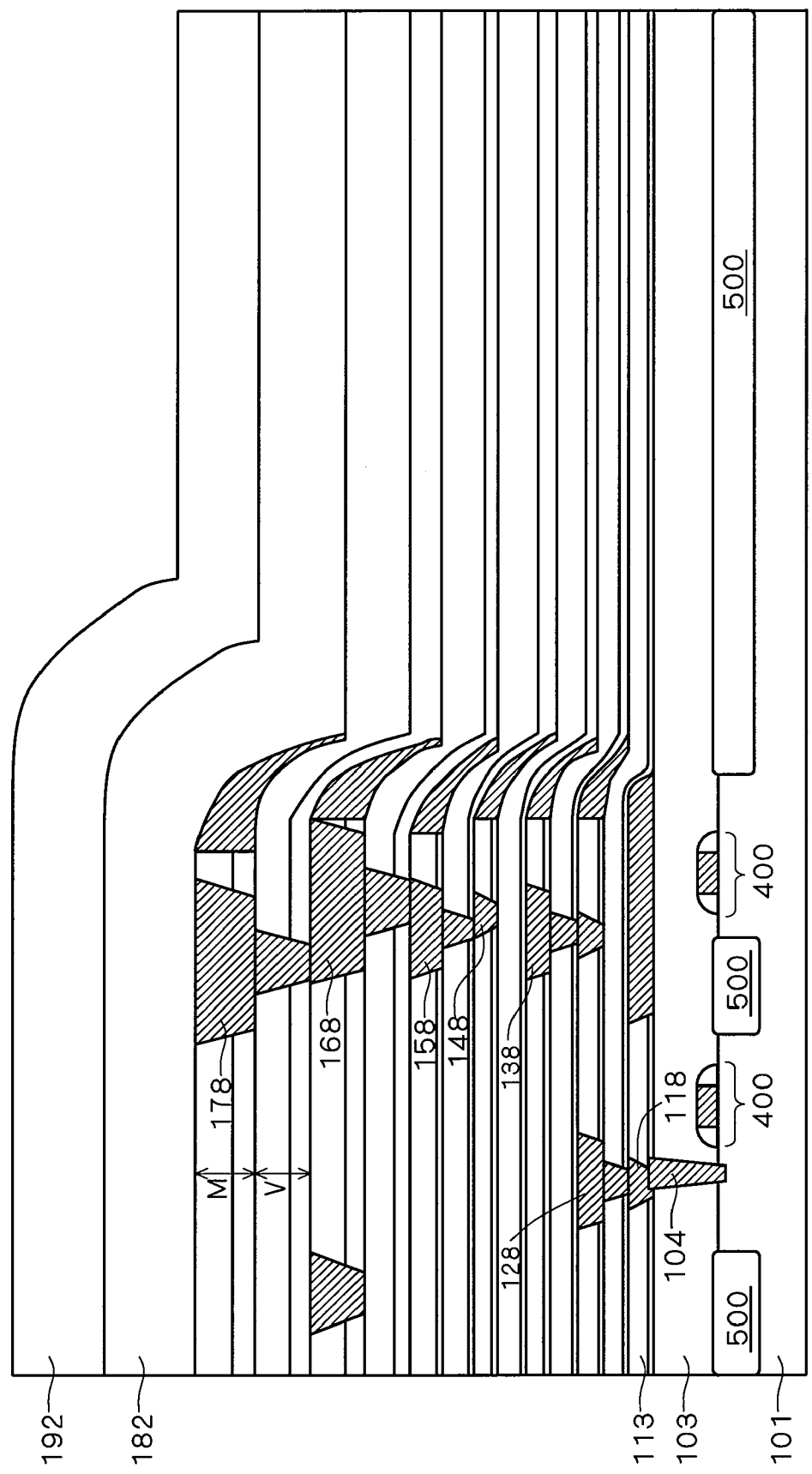
FIG. 40 is a cross sectional diagram showing the structure of a semiconductor wafer according to a fifth preferred embodiment.
Figure 41:
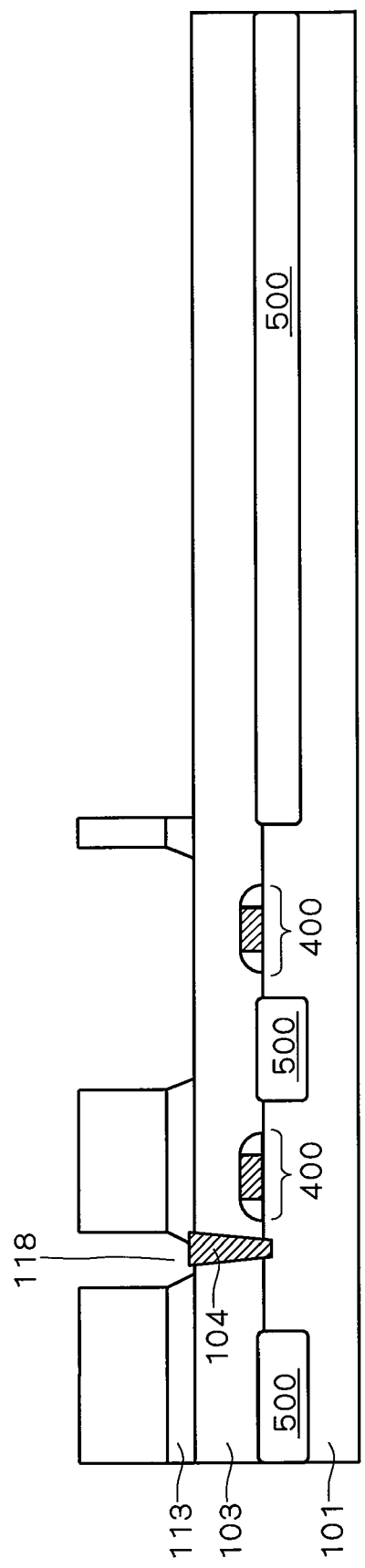
FIGS. 41 to 46 are cross sectional diagrams each showing one step in a manufacturing method for a semiconductor device according to the fifth preferred embodiment.
Figure 42:
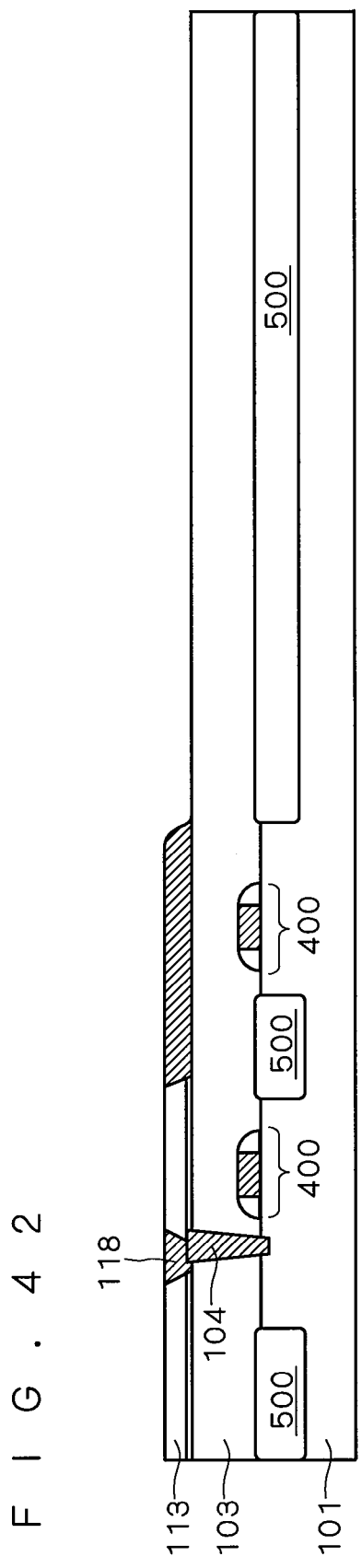

FIG. 40 is a cross sectional diagram showing the structure of a semiconductor wafer according to a fifth preferred embodiment. FIG. 40, in comparison with FIG. 33, shows the case where the V layers are not removed from the wafer edge portion.

FIGS. 41 to 46 are cross sectional diagrams showing the steps in a manufacturing method for the semiconductor device in FIG. 40. FIGS. 41 to 46 correspond to FIGS. 34 to 39, all of which illustrate almost the same steps so that the detailed description thereof is omitted.

In the single damascene procedure according to the first preferred embodiment, as shown in FIG. 15, the via liner films and the via interlayer films, which are not covered with a resist mask, are removed from the wafer edge portion at the formation of the via patterns, while, as shown in FIG. 16, the interconnect liner films and the interconnect interlayer films, which are not covered with a resist mask, are removed from the wafer edge portion at the formation of the interconnection patterns.

Figure 43:
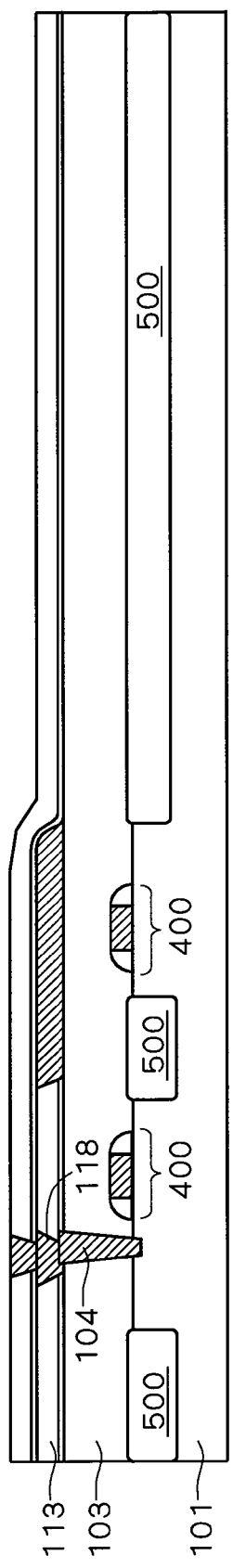
Figure 44:
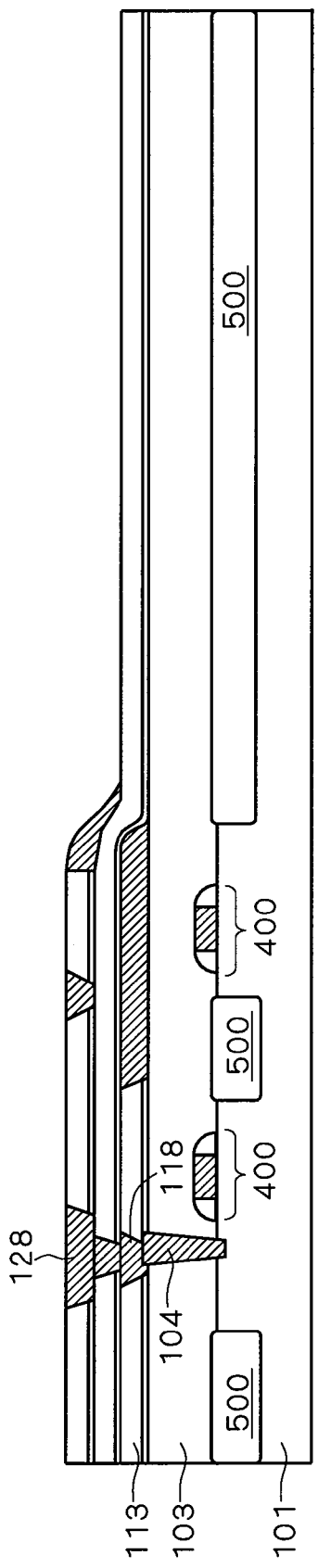
Figure 45:
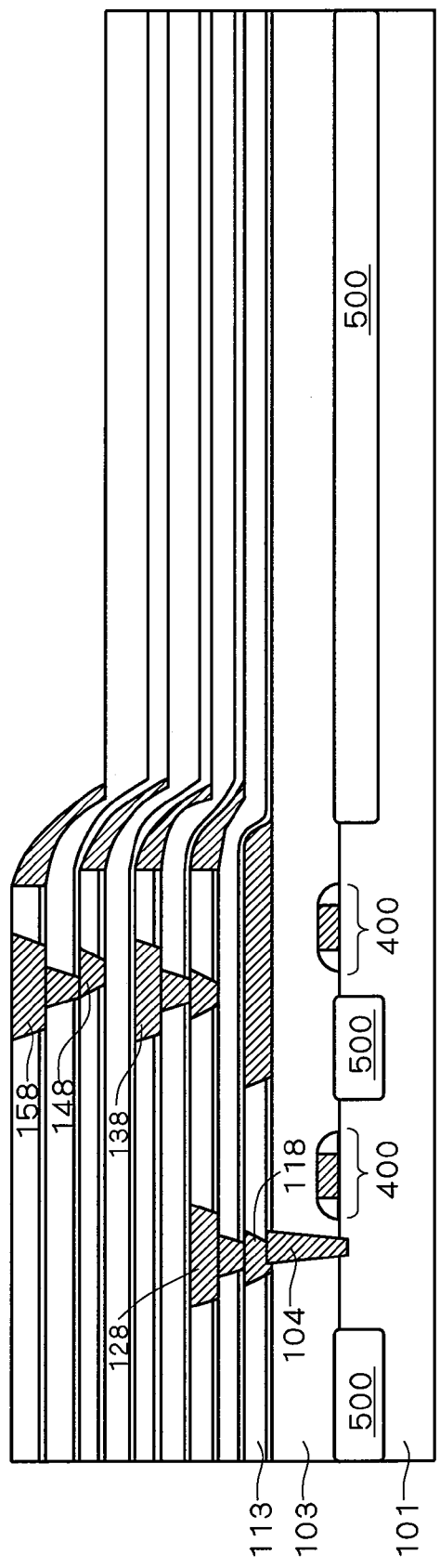
Figure 46:
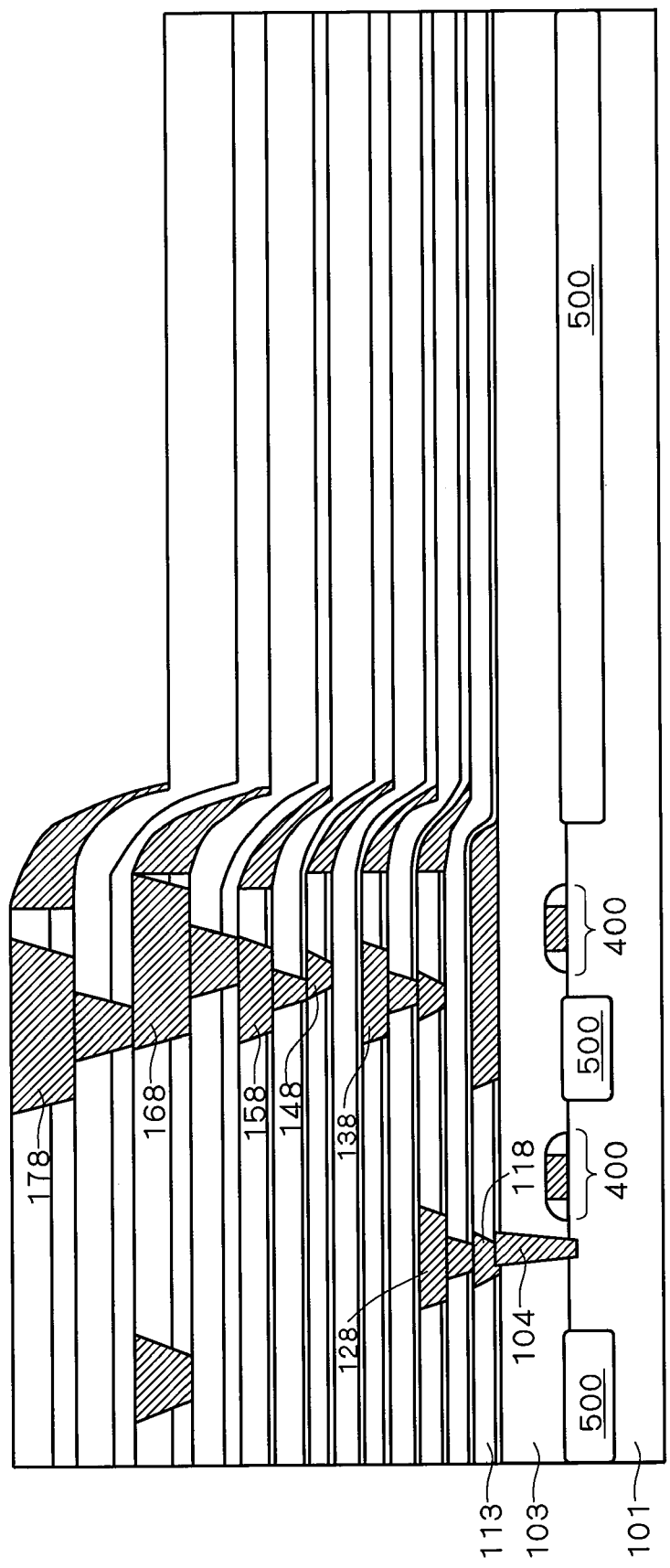

In the single damascene procedure according to the present preferred embodiment, on the other hand, as shown in FIG. 43, the via liner films and the via interlayer films, which are covered with a resist mask, are not removed from the wafer edge portion at the formation of the via patterns, while, as shown in FIG. 44, the interconnect liner films and the interconnect interlayer films, which are not covered with a resist mask, are removed from the wafer edge portion at the formation of the interconnection patterns. In other words, the resist mask is also removed from the wafer edge portion by peripheral exposure to light during lithography of the interconnect layers. The other steps are identical to those in the single damascene procedure according to the first preferred embodiment.

As described above, the semiconductor wafer and the manufacturing method for a semiconductor device according to the present preferred embodiment, in comparison with those in the second and third preferred embodiments, allow a reduction in the number of manufacturing recipe types, thus reducing management cost.

Although the V layers are not removed from the wafer edge portion according to the present preferred embodiment, the volume of the interlayer films can be reduced by removing the M layers from the wafer edge portion; therefore, in comparison with the case in FIG. 3, it is possible to reduce the risk of the occurrence of peeling-off of films in the wafer edge portion. The removal of the M layers further prevents the occurrence of pattern deformation resulting from the generation of an undesired pattern due to defocusing. In addition, the non-removal of the V layers from the wafer edge portion allows the formation of vias in the V layers in the wafer edge portion. These vias, which are part of the wafer edge portion, are prone to be defocused because they are exposed at different levels from those vias located other than in the wafer edge portion. However, even if such a hole-like via pattern is defocused, the result is only a reduction of hole diameter or a disappearance of the pattern itself, and it is not the case where such an undesired pattern as resulting in pattern deformation is formed and the resultant via causes pattern skipping.

Furthermore, according to the present preferred embodiment, the V layers are not removed from the wafer edge portion, but the M layers are removed from the wafer edge portion. This is to avoid the following inconveniences. For example if both the V layers and the M layers are removed, the contact interlayer film 103 in the wafer edge portion will be etched little by little during dry etching of the via patterns or the interconnect patterns in each layer. This is because each layer is supposed to be over-etched in order to form the via or interconnect patterns without failure. Thus, the greater the number of layers is, the more the contact interlayer film 103 in the wafer edge portion is over-etched after all the processes, and in the end, the semiconductor substrate 101 will be exposed. If, in this condition, another layer is additionally laminated, the barrier metal for that additionally laminated layer will be formed directly on the semiconductor substrate 101. As a result, the layer above the barrier metal for the additionally laminated layer will peel off due to stresses caused by heat treatment or the like performed after the formation of the barrier metal for the additionally laminated layer. The non-removal of the V layers from the wafer edge portion, as in the present preferred embodiment, prevents such overetching of the contact interlayer film 103 in the wafer edge portion in each process.

Sixth Preferred Embodiment

The fifth preferred embodiment provides the case where, in the single damascene procedure, the V layers are not removed from the wafer edge portion (the wafer-edge rinse width is 0 mm) and the M layers are removed from the wafer edge portion (the wafer-edge rinse width is 3.0 mm). No only in the single damascene procedure but also in the dual damascene procedure, only the M layers may be removed from the wafer edge portion without removing the V layers therefrom. In this case, unlike in the fifth preferred embodiment, both the M layers and the V layers include Low-k ($k \leq 3.0$) films.

Figure 47:
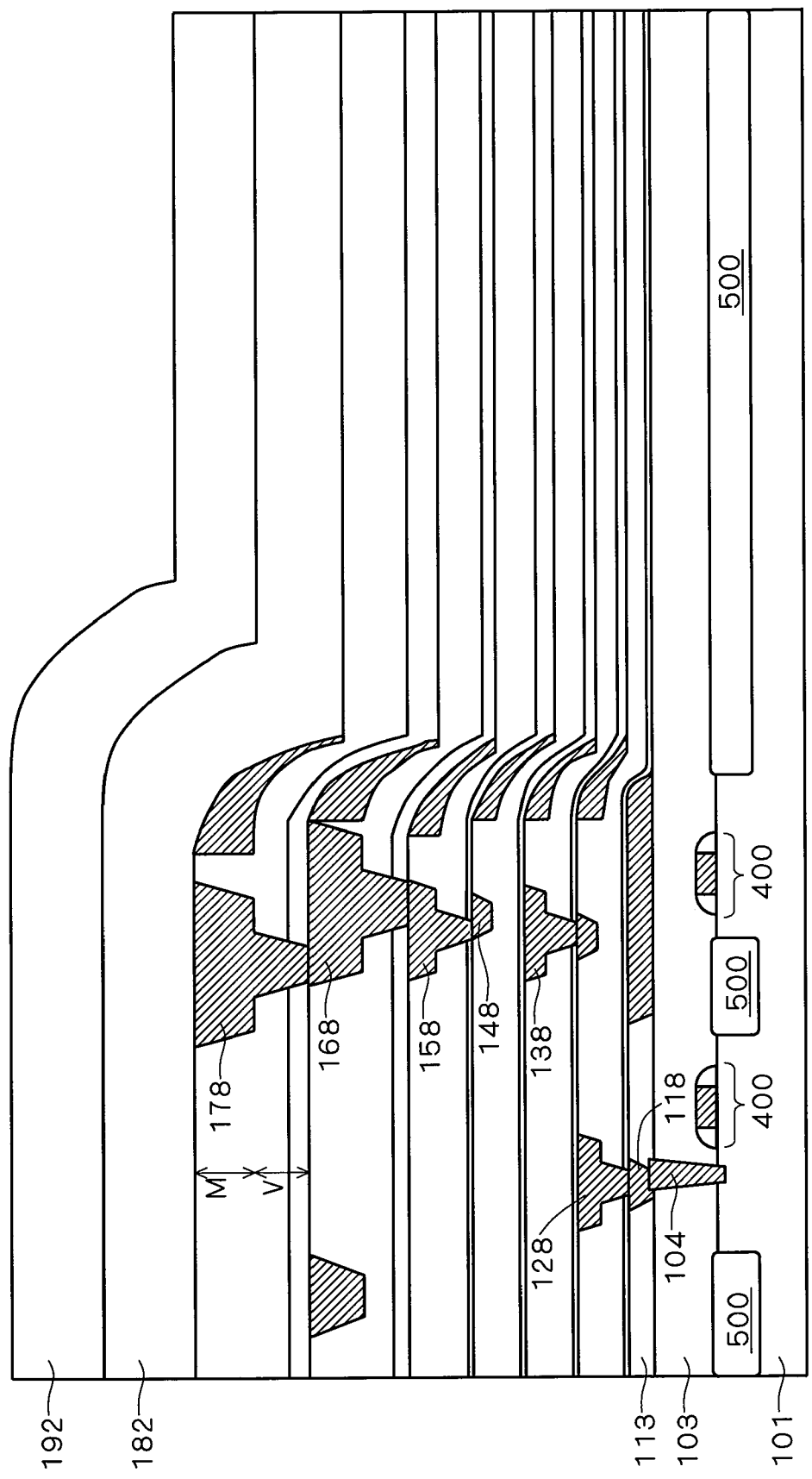
FIG. 47 is a cross sectional diagram showing the structure of a semiconductor wafer according to a sixth preferred embodiment.
Figure 48:
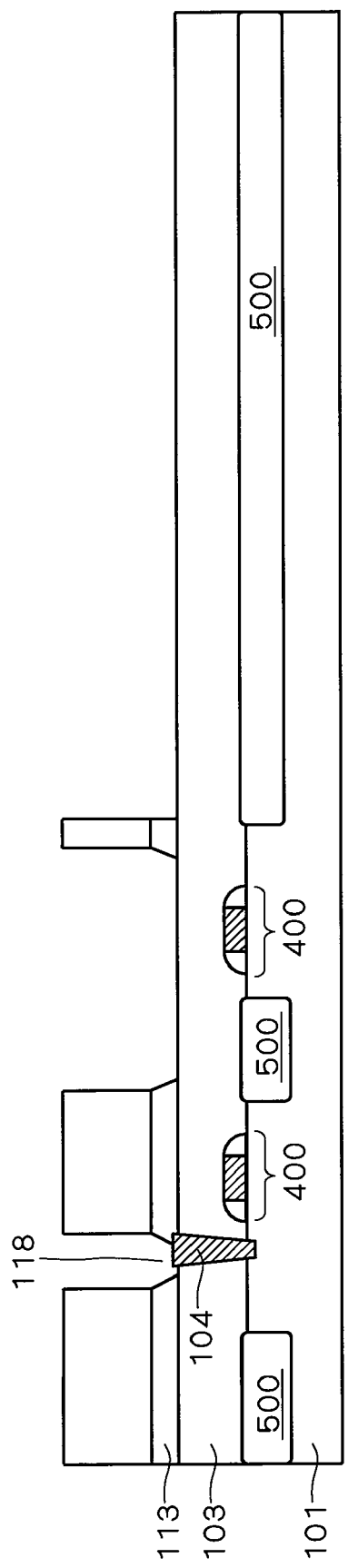
FIGS. 48 to 52 are cross sectional diagrams each showing one step in a manufacturing method for a semiconductor device according to the sixth preferred embodiment.
Figure 49:
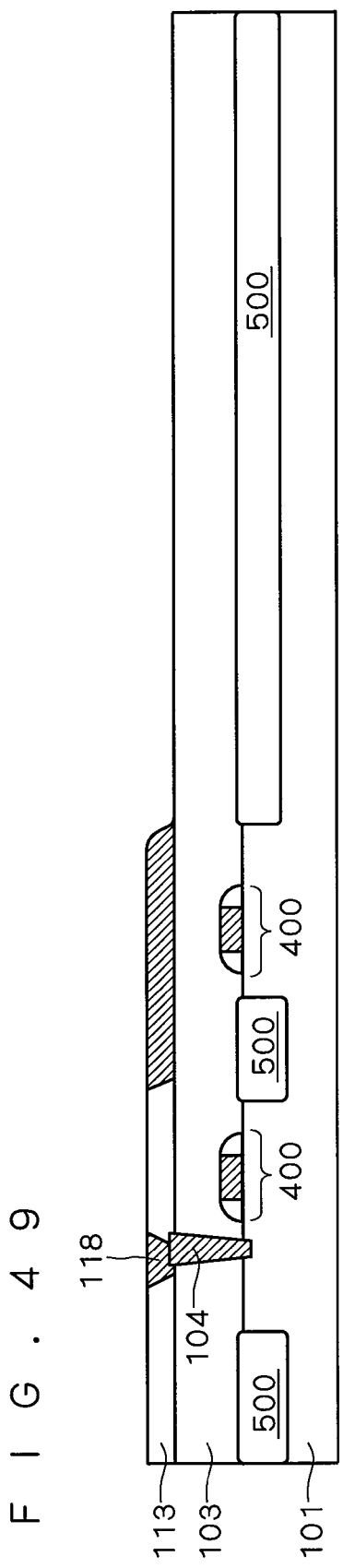

FIG. 47 is a cross sectional diagram showing the structure of a semiconductor wafer according to a sixth preferred embodiment. FIG. 47, in comparison with FIG. 40, shows the case of using the dual damascene procedure instead of the single damascene procedure (where only the lowermost layer, i.e., the first interlayer film 113, in the multilayer interconnection structure is formed through the single damascene procedure).

FIGS. 48 to 52 are cross sectional diagrams showing the steps in a manufacturing method for the semiconductor device in FIG. 47. Specifically, FIG. 48 corresponds to FIG. 41, FIG. 49 to FIG. 42, FIG. 50 to FIGS. 43 and 44, FIG. 51 to FIG. 45, and FIG. 52 to FIG. 46, all of which illustrate almost the same steps so that the detailed description thereof is omitted.

In the dual damascene procedure according to the first preferred embodiment, as shown in FIG. 7, a single interlayer film is formed on a single liner film; the via patterns and the interconnection patterns are formed in sequence; and the vias and the interconnect lines are formed by one process. The interlayer films, which are not covered with a resist mask, are removed from the wafer edge portion at the formation of the via pattern, while the liner films, which are covered with a resist mask, are not removed from the wafer edge portion at the formation of the interconnection pattern, but they are removed from the wafer edge portion at the same time when they are etched in a subsequent process.

Figure 50:
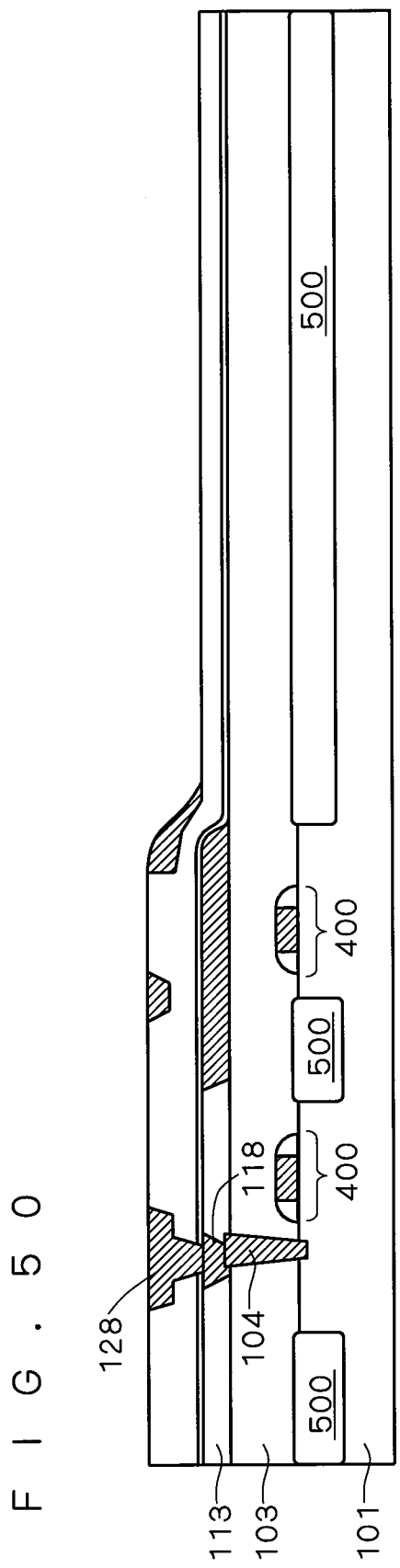
Figure 51:
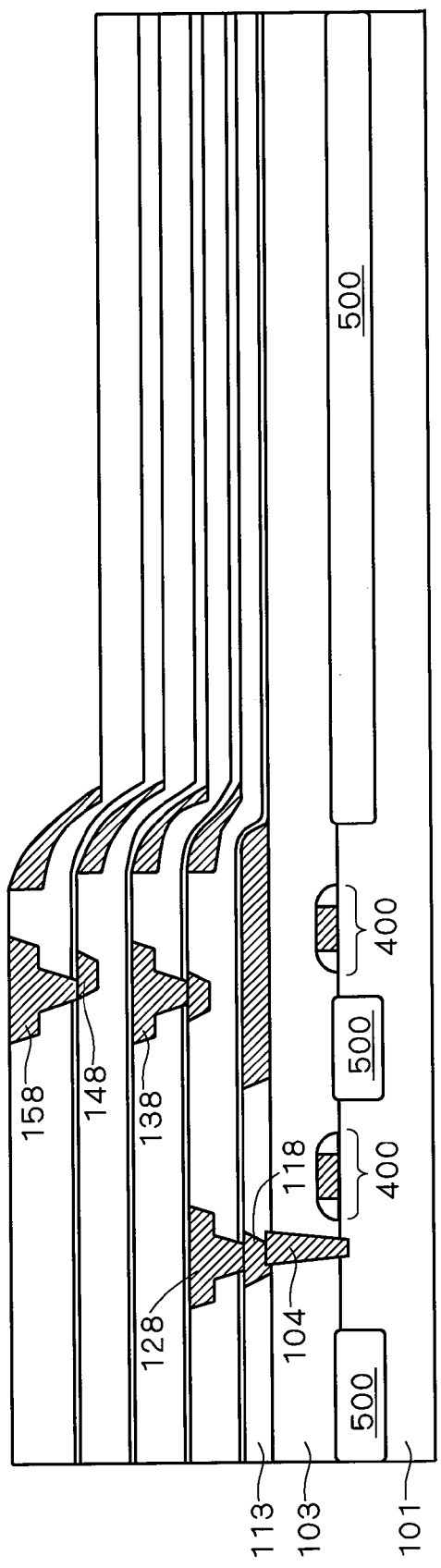
Figure 52:
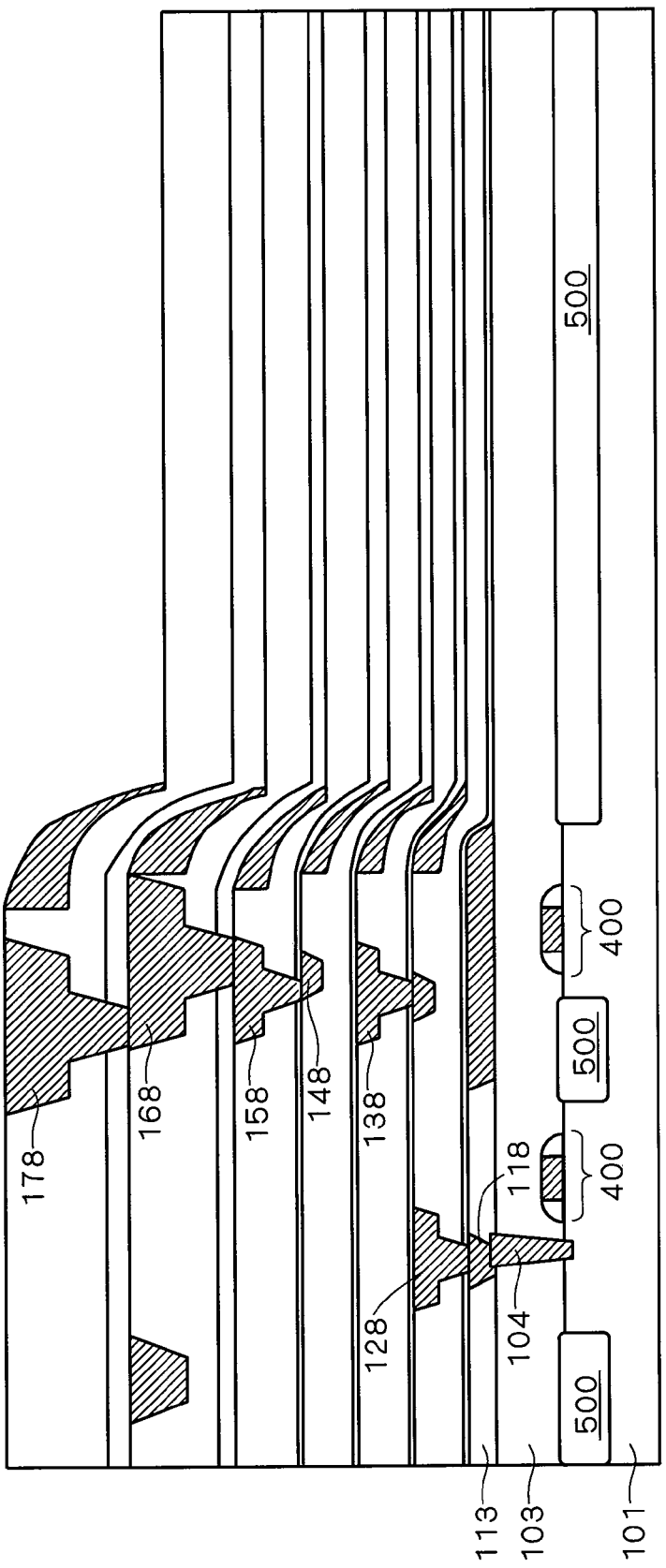

In the dual damascene procedure according to the present preferred embodiment, on the other hand, as shown in FIG. 50, a single interlayer film is formed on a single liner film; the via patterns and the interconnection patterns are formed in sequence; and the vias and the interconnect lines are formed by one process. The liner films and the interlayer films, which are covered with a resist mask, are not removed from the wafer edge portion at the formation of the via pattern, and upper portions of the interlayer films, which are not covered with a resist mask, are partially removed from the wafer edge portion at the formation of the interconnection pattern. In other words, the resist mask is removed from the wafer edge portion by peripheral exposure to light during lithography of the interconnect layer, and that resist mask is used to etch the wafer to the depths of the interconnect layers, so that the removal to the depths of the interconnect lines (partial removal of the upper portions of the interconnect films) is possible even in the wafer edge portion. The other steps are identical to those in the dual damascene procedure according to the first preferred embodiment.

As described above, in the semiconductor wafer and the manufacturing method for a semiconductor device according to the present preferred embodiment, the V layers are left without being removed from the wafer edge portion in the dual damascene procedure. Accordingly, in comparison with the case of the single damascene procedure, it is possible to prevent the contact interlayer film 103 from being removed by etching even when the multilayer interconnection structure is formed through the dual damascene procedure where, as described in the first preferred embodiment, the amount of etching is prone to increase due to the shortage of a filling material. Although the filling material is also deposited on the wafer edge portion when filling in the formed vias, it is difficult to uniformly deposit the filling material in the wafer edge portion. Thus, the filling material is prone to be completely etched from the wafer edge portion in the etching process for formation of trenches for interconnect lines, and as a result, part of the layer therebelow is prone to be etched. If the V layers remain, the layers to be etched after disappearance of the filling material are those V layers. This prevents peeling-off of films and pattern skipping in the wafer edge portion even in the dual damascene procedure.

Seventh Preferred Embodiment

The sixth preferred embodiment provides the case where the V layers are not removed from the wafer edge portion, and only the M layers are removed to the wafer-edge rinse width of 3.0 mm from the wafer edge portion. As an alternative, the wafer-edge rinse width when the M layers are removed from the wafer edge portion may partly differ from layer to layer in the Fine layer and in the semi-global layer.

Figure 53:
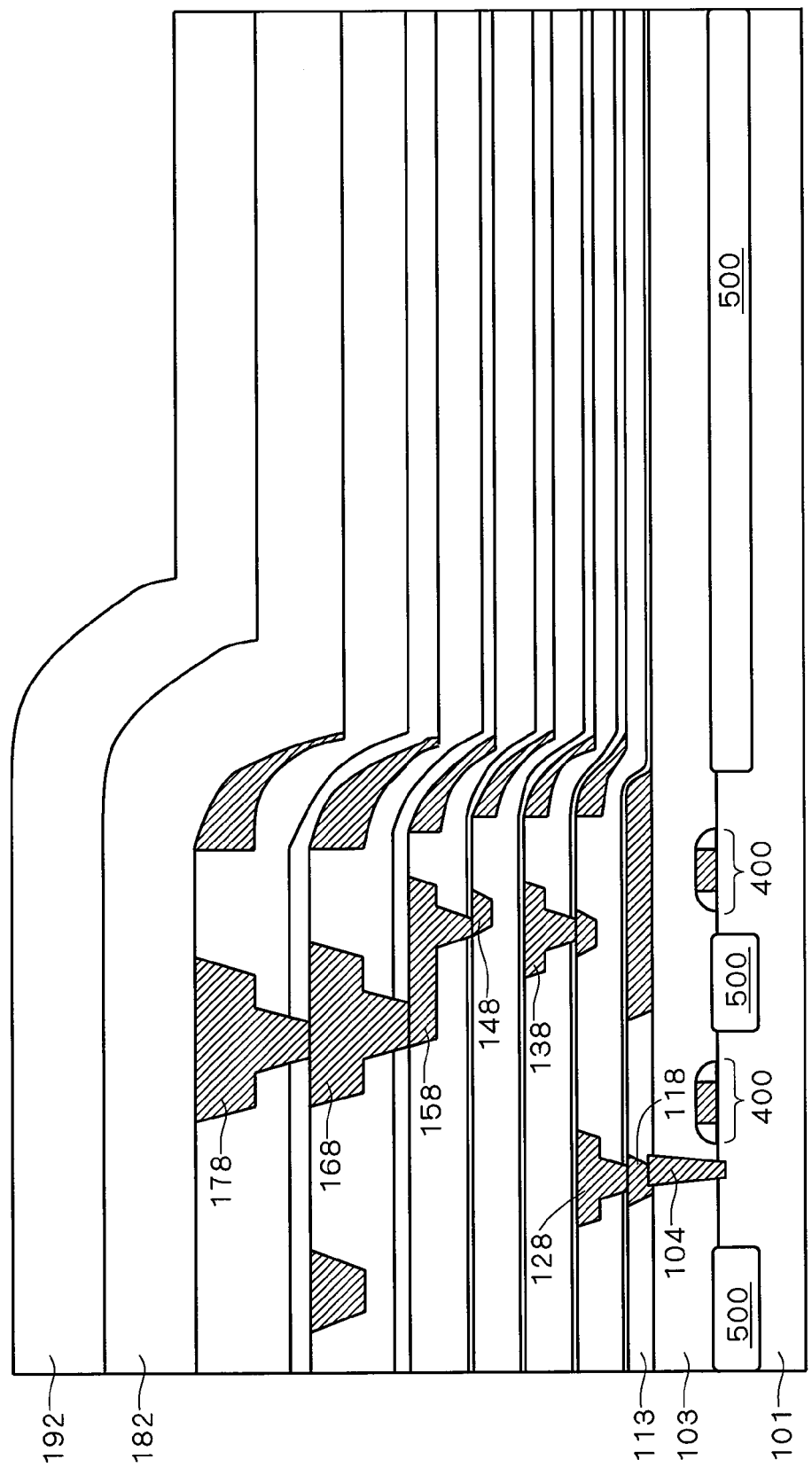
FIG. 53 is a cross sectional diagram showing the structure of a semiconductor wafer according to a seventh preferred embodiment.

FIG. 53 is a cross sectional diagram showing the structure of a semiconductor wafer according to a seventh preferred embodiment. FIG. 53, in comparison with FIG. 47, shows the case where the wafer-edge rinse width when the M layers are removed from the wafer edge portion differs between the Fine layer and the semi-global layer. To be more specific, the wafer-edge rinse width for the M layers in the Fine layer is 2.5 mm, and the wafer-edge rinse width for the M layers in the semi-global layers is 3.0 mm.

Figure 54:
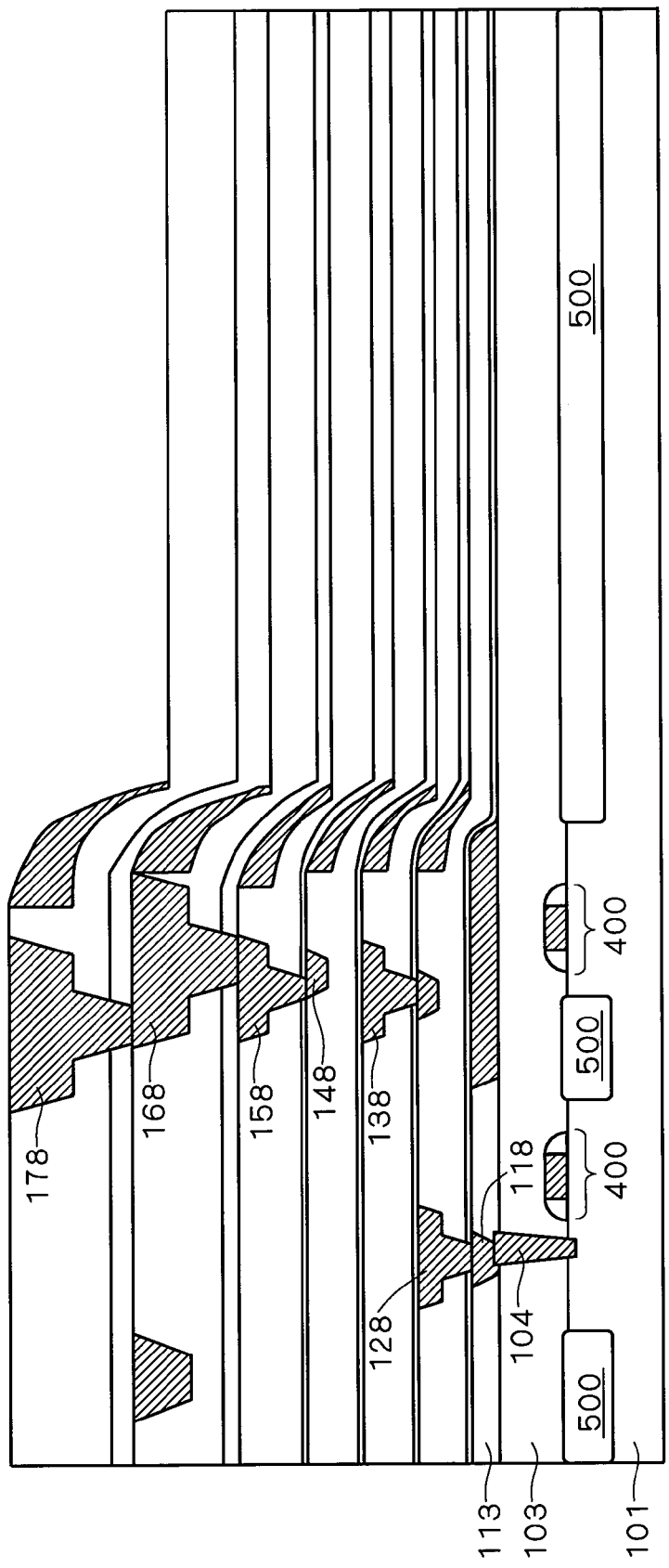
FIG. 54 is a cross sectional diagram showing one step in a manufacturing method for a semiconductor device according to the seventh preferred embodiment.

FIG. 54 is a cross sectional diagram showing one step in a manufacturing method for the semiconductor device in FIG. 53. Specifically, after completion of the steps in FIGS. 48 to 51 (after the removal of the Fine layer to the wafer-edge rinse width of 2.5 mm from the wafer edger portion), as shown in FIG. 54, the semi-global layer is removed to the wafer-edge rinse width of 3.0 mm from the wafer edge portion. The other steps are identical to those described in the sixth preferred embodiment.

As described above, the semiconductor wafer and the manufacturing method for a semiconductor device according to the present preferred embodiment, in comparison with those in the sixth preferred embodiment, allow a reduction in the wafer-edge rinse width for the M layers in the Fine layer. This allows effective use of a larger area of the silicon substrate 1, thus increasing the number of chips to be mounted thereon.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method for a semiconductor device, comprising:
    (a) providing a semiconductor substrate;
    (b) forming a plurality of gate structures on the semiconductor substrate;
    (c) forming a first interlayer film to cover the semiconductor substrate and the gate structures;
    (d) forming a first wiring layer over the first interlayer film, the first wiring layer including sub-steps of:
        (d-1) forming a first layer including a second interlayer film with a dielectric constant of 3.0 or lower and a via;
        (d-2) after step (d-1), forming a second layer including a third interlayer film with a dielectric constant of 3.0 or lower and a wire; and
    (e) after step (d), forming at least one of upper wiring layers over the first wiring layer, each of the upper wiring layers being formed by performing the same step as step (d), wherein
    the first interlayer film and the second interlayer film are not removed from a wafer edge portion of the semiconductor substrate, and
    the third interlayer film is removed in a given width from the wafer edge portion of the semiconductor substrate.

2. The manufacturing method for a semiconductor device according to claim 1, wherein in step (d), the wiring layer is formed by a dual damascene process.

3. The manufacturing method for a semiconductor device according to claim 1, wherein
    a width of the third interlayer film removed in the upper wiring layer is different from the given width of the third interlayer film in the first wiring layer.

4. The manufacturing method for a semiconductor device according to claim 3, wherein
    the third interlayer film includes a plurality of films.

5. The manufacturing method for a semiconductor device according to claim 1, further comprising:
    forming an isolation film on the semiconductor substrate to isolate said plurality of gate structures, wherein
    in step (b), the plurality of gate structures are not formed on an area of said semiconductor substrate where the third interlayer film is removed.

6. A manufacturing method for a semiconductor device, comprising:
    (a) providing a semiconductor substrate;
    (b) forming a plurality of gate structures on the semiconductor substrate;
    (c) forming a first interlayer film to cover the semiconductor substrate and the gate structures;
    (d) forming a first wiring layer over the first interlayer film, the first wiring layer including a sub-step of:
        (d-1) forming a first layer including a second interlayer film with a dielectric constant of 3.0 or lower and a via;
        (d-2) after step (d-1), forming a second layer including a third interlayer film with a dielectric constant of 3.0 or lower and a wire; and
    (e) after step (d), forming at least one of upper wiring layers over the first wiring layer, each of the upper wiring layers being formed by performing the same step as step (d), wherein the first interlayer film and the second interlayer film are arranged on a wafer edge portion of the semiconductor substrate, and the third interlayer film is removed in a given width from the wafer edge portion of the semiconductor substrate.

7. The manufacturing method for a semiconductor device according to claim 6, wherein in step (d), the wiring layer is formed by a dual damascene process.

8. The manufacturing method for a semiconductor device according to claim 6, wherein a width of the third interlayer film removed in the upper wiring layer is different from the given width of the third interlayer film in the first wiring layer.

9. The manufacturing method for a semiconductor device according to claim 8, wherein the third interlayer film includes a plurality of films.

10. The manufacturing method for a semiconductor device according to claim 6, further comprising:

forming an isolation film on the semiconductor substrate to isolate said plurality of gate structures, wherein in step (b), the plurality of gate structures are not formed on an area of said semiconductor substrate where the third interlayer film is removed.

* * * * *